US011185895B2

(12) United States Patent
Tanabe et al.

(10) Patent No.: US 11,185,895 B2
(45) Date of Patent: Nov. 30, 2021

(54) SUBSTRATE PROCESSING METHOD, SUBSTRATE PROCESSING APPARATUS, AND COMPOSITE PROCESSING APPARATUS

(71) Applicant: TOSHIBA MEMORY CORPORATION, Tokyo (JP)

(72) Inventors: Mana Tanabe, Kanagawa (JP); Hideaki Sakurai, Kanagawa (JP); Kosuke Takai, Kanagawa (JP); Kyo Otsubo, Tokyo (JP); Minako Inukai, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 146 days.

(21) Appl. No.: 16/299,934

(22) Filed: Mar. 12, 2019

(65) Prior Publication Data

US 2020/0078834 A1 Mar. 12, 2020

(30) Foreign Application Priority Data

Sep. 6, 2018 (JP) .............................. JP2018-167153

(51) Int. Cl.
*B08B 7/00* (2006.01)
*B08B 3/10* (2006.01)
*H01L 21/02* (2006.01)
*H01L 21/67* (2006.01)

(52) U.S. Cl.
CPC .............. *B08B 7/0092* (2013.01); *B08B 3/10* (2013.01); *H01L 21/02057* (2013.01); *H01L 21/6715* (2013.01); *H01L 21/67051* (2013.01); *H01L 21/67109* (2013.01); *H01L 21/67248* (2013.01)

(58) Field of Classification Search
CPC ............ B08B 7/0092; H01L 21/02041–02101
See application file for complete search history.

(56) References Cited

U.S. PATENT DOCUMENTS

| | | | | |
|---|---|---|---|---|
| 2002/0142617 A1* | 10/2002 | Stanton | ................... | B08B 13/00 438/749 |
| 2008/0121252 A1* | 5/2008 | Miya | ..................... | B08B 7/0092 134/4 |
| 2008/0308132 A1* | 12/2008 | Tomita | ...................... | B08B 3/10 134/36 |
| 2010/0163084 A1* | 7/2010 | Haibara | ............ | H01L 21/67051 134/184 |
| 2018/0047559 A1* | 2/2018 | Kamiya | ................. | H01L 22/12 |
| 2018/0264524 A1* | 9/2018 | Tanaka | ...................... | B08B 3/10 |

FOREIGN PATENT DOCUMENTS

| | | |
|---|---|---|
| JP | H9-22885 A | 1/1997 |
| JP | 4906418 B2 | 3/2012 |

* cited by examiner

*Primary Examiner* — Rita P Adhlakha
*Assistant Examiner* — Omair Chaudhri
(74) *Attorney, Agent, or Firm* — Finnegan, Henderson, Farabow, Garrett & Dunner L.L.P.

(57) ABSTRACT

According to one embodiment, a first liquid is supplied on a first face of a substrate. The first liquid has a pH with which a surface zeta potential of the substrate becomes negative and a surface zeta potential of a foreign substance attaching to the first face becomes positive. Then, a solidified layer in which at least part of the first liquid has been solidified is formed by cooling the substrate down to be equal to or lower than a solidification point of the first liquid. Thereafter, the solidified layer is melted.

5 Claims, 24 Drawing Sheets

| MATERIAL NAME | pH | PROCESSING LIQUID |
|---|---|---|
| $Al_2O_3$ | 7.4 TO 9.2 | OZONIZED WATER, HYDROGEN PEROXIDE SOLUTION, CARBONATED WATER |
| $Cr_2O_3$ (HYDRATE) | 6.5 TO 7.4 | |
| $Fe_3O_4$ ($FeO_3$) | 6.5 TO 8.3 | |
| NiO | 10.3 | |
| $Y_2O_3$ (HYDRATE) | 9.3 | |

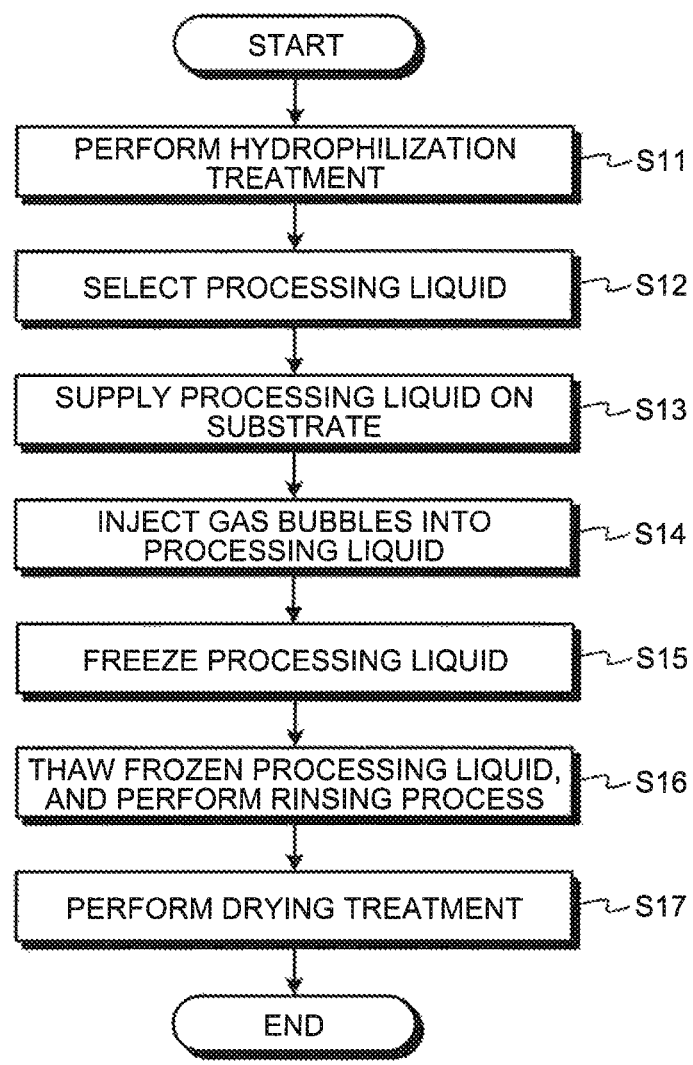

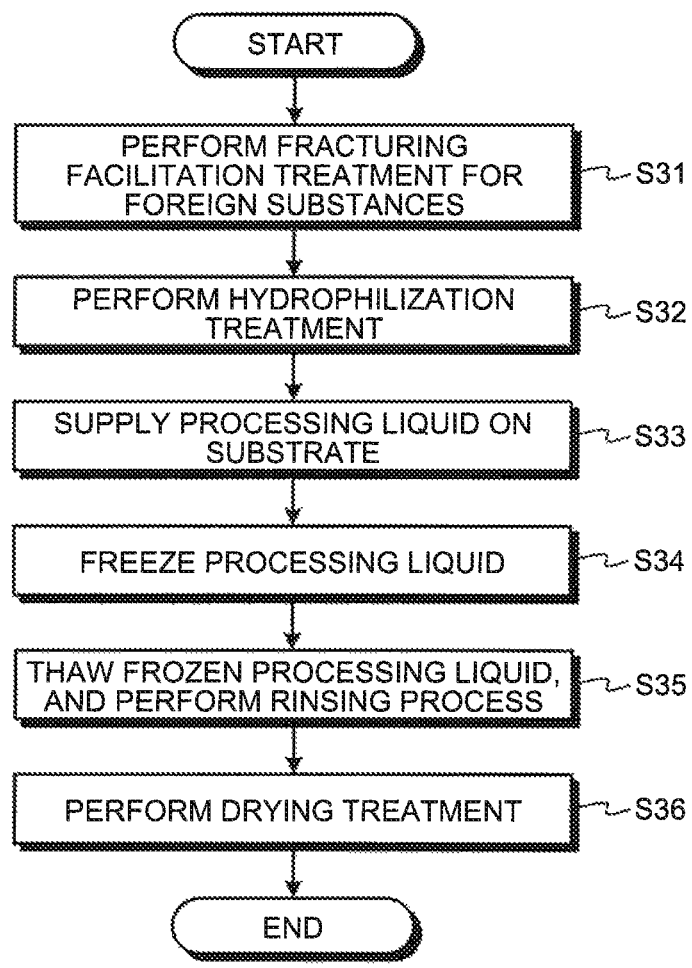

SUBSTRATE PROCESSING METHOD, SUBSTRATE PROCESSING APPARATUS, AND COMPOSITE PROCESSING APPARATUS

CROSS-REFERENCE TO RELATED APPLICATIONS

This application is based upon and claims the benefit of priority from Japanese Patent Application No. 2018-167153, filed on Sep. 6, 2018; the entire contents of which are incorporated herein by reference.

FIELD

Embodiments described herein relate generally to a substrate processing method, a substrate processing apparatus, and a composite processing apparatus.

BACKGROUND

Conventionally, a cleaning technique is known, which brings a cooling medium into contact with the backside of a template to freeze a liquid supplied on the frontside of the template and thereby to form a frozen film, and then removes the frozen film to remove foreign substances from the frontside of the template.

However, there is a case where foreign substances cannot be removed even by such freeze cleaning, depending on the size of the foreign substances. Accordingly, there is a demand for a cleaning technique that can remove foreign substances attaching to a template regardless of the size of the foreign substances.

BRIEF DESCRIPTION OF THE DRAWINGS

FIG. 8 is a flowchart illustrating an example of the sequence of a substrate processing method according to the first embodiment;

FIG. 11 is a flowchart illustrating an example of the sequence of a substrate processing method according to a second embodiment;

DETAILED DESCRIPTION

In general, according to one embodiment, a first liquid is supplied on a first face of a substrate. The first liquid has a pH with which a surface zeta potential of the substrate becomes negative and a surface zeta potential of a foreign substance attaching to the first face becomes positive. Then, a solidified layer in which at least part of the first liquid has been solidified is formed by cooling the substrate down to be equal to or lower than a solidification point of the first liquid. Thereafter, the solidified layer is melted.

Exemplary embodiments of a substrate processing method, a substrate processing apparatus, and a composite processing apparatus will be explained below in detail with reference to the accompanying drawings. The present invention is not limited to the following embodiments.

First Embodiment

Figure 1A:
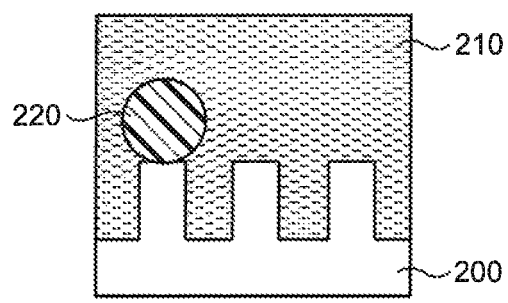
FIGS. 1A to 1C are diagrams illustrating an example of processing procedures of freeze cleaning.
Figure 1B:
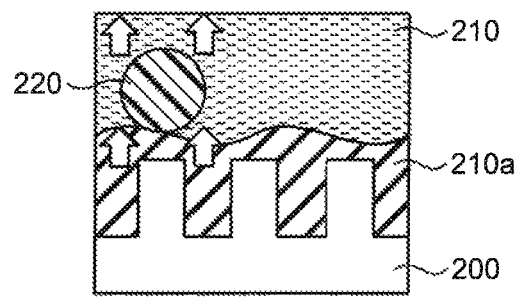
Figure 1C:
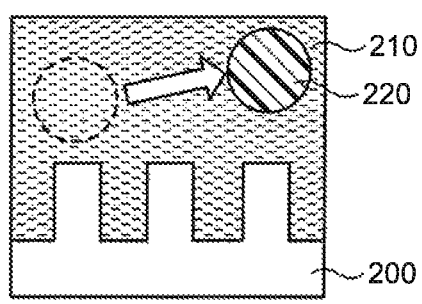

FIGS. 1A to 1C are diagrams illustrating an example of processing procedures of freeze cleaning. Here, it is assumed that foreign substances (particles) 220 are attaching to a face formed with a pattern of a substrate 200 serving as an object of a cleaning process. The substrate 200 is a template to be used for imprint processing, a photomask to be used in a light exposure apparatus, a blank substrate without any pattern formed thereon, or the like. Further, as the foreign substances 220, there are organic foreign substances and/or inorganic foreign substances. Here, in the following description, about the substrate 200 being subjected to a cleaning process, the face oriented upward will be referred to as "upper face", and the face oriented downward will be referred to as "lower face". Further, in the substrate 200, the face formed with a pattern will be referred to as "frontside", and the face opposite to the frontside will be referred to as "backside". When the substrate 200 is placed in an apparatus in a state where the frontside is on the upper side, the upper face of the substrate 200 is the frontside. On the other hand, when the substrate 200 is placed in an apparatus in a state where the frontside is on the lower side, the upper face of the substrate 200 is the backside. FIGS. 1A to 1C illustrate a state where the frontside of the substrate 200 is the upper face.

As illustrated in FIG. 1A, a processing liquid is supplied onto the upper face of the substrate 200 with the foreign substances 220 attaching thereto, and a processing liquid 210 is thereby formed. Then, as illustrated in FIG. 1B, a cooling liquid or cooled gas, which has a temperature lower than the solidification temperature of the processing liquid, is supplied onto the lower face of the substrate 200, and the processing liquid 210 is thereby frozen (solidified). Consequently, a frozen layer 210a that is a solidified layer is formed from the substrate 200 side of the processing liquid 210. Since the processing liquid 210 expands its volume when being frozen, the foreign substances 220 attaching to the upper face of the substrate 200 are lifted toward the side separating from the upper face of the substrate 200, during formation of the frozen layer 210a. Then, in this state, as illustrated in FIG. 1C, the frozen layer 210a is thawed (melted), and a rinsing process is performed, by supplying a processing liquid, for example. Consequently, the foreign substances 220 lifted from the upper face of the substrate 200 are washed out by the processing liquid, and thus the foreign substances 220 are removed. The above-described process of removing the foreign substances by utilizing freezing will be referred to as "freeze cleaning".

Figure 2A:
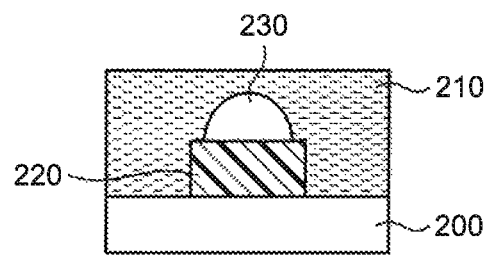
FIGS. 2A to 2C are diagrams illustrating a model of removing foreign substances by the freeze cleaning, in a case where gas bubbles are contained.
Figure 2B:
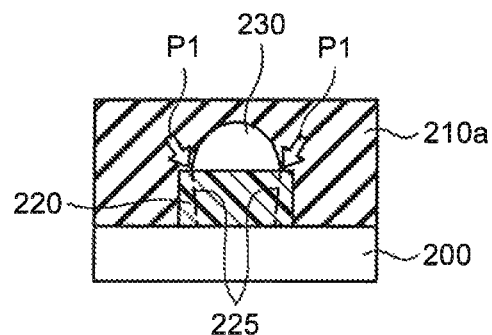
Figure 2C:
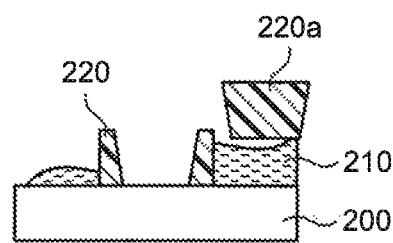

In the freeze cleaning, organic foreign substances 220 each having a diameter of, for example, larger than 200 nm can be hardly removed. However, where the processing liquid 210 contains gas bubbles, large foreign substances 220 can be removed. FIGS. 2A to 2C are diagrams illustrating a model of removing foreign substances by the freeze cleaning, in a case where gas bubbles are contained. As illustrated in FIG. 2A, it is assumed that gas bubbles 230 attach to foreign substances 220 when the processing liquid 210 is formed on the substrate 200. In this state, as illustrated in FIG. 2B, when the processing liquid 210 is frozen, a frozen layer 210a is formed from the substrate 200 side of the processing liquid 210, as described with reference to FIGS. 1A to 1C. Here, it is assumed that the frozen layer 210a is formed up to a position higher than the upper side of the gas bubbles 230. At this time, due to expansion of the frozen layer 210a, a pressure P1 is applied to the boundary between each foreign substance 220 and a gas bubble 230 attaching thereto, and a crack 225 is generated from this boundary serving as the starting point. Thereafter, as illustrated in FIG. 2C, when the frozen layer 210a is thawed and a rinsing process is performed, a region 220a with the gas bubble 230 attaching thereto in the foreign substance 220 is removed.

Figure 3A:
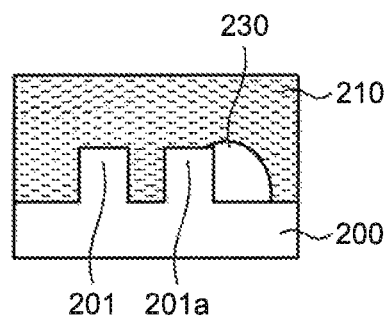
FIGS. 3A to 3C are diagrams illustrating a model of pattern collapse due to the freeze cleaning, in a case where gas bubbles are contained.
Figure 3B:
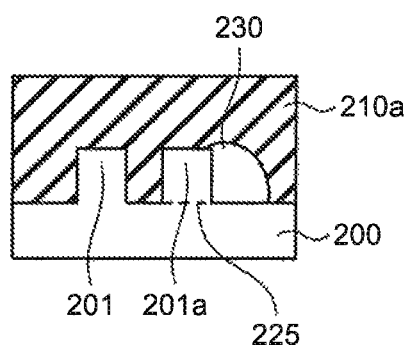
Figure 3C:
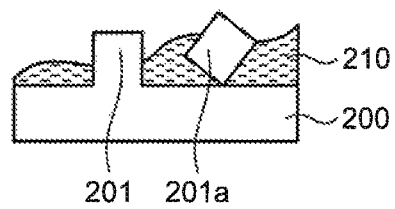

However, there is a case where gas bubbles 230 in the processing liquid 210 attach not only to the foreign substances 220, but also to the pattern formed on the substrate 200. In this case, the pattern could be collapsed by gas bubbles 230 attaching thereto. FIGS. 3A to 3C are diagrams illustrating a model of pattern collapse due to the freeze cleaning, in a case where gas bubbles are contained. As illustrated in FIG. 3A, it is assumed that gas bubbles 230 attach to side surfaces of protruding portions 201a of a pattern formed on the substrate 200, when a processing liquid 210 is formed on the substrate 200. In this state, as illustrated in FIG. 3B, when the processing liquid 210 is frozen, a frozen layer 210a is formed from the substrate 200 side of the processing liquid 210, as described with reference to FIGS. 1A to 1C. Here, it is assumed that the frozen layer 210a is formed up to a position higher than the upper side of the gas bubbles 230. At this time, at each protruding portion 201 without any gas bubble 230 attaching to its side surface, a pressure is applied equally to every side surface, due to expansion of the frozen layer 210 intruding between protruding portions 201, and thus this protruding portion 201, i.e., part of the pattern, is not collapsed. On the other hand, at each protruding portion 201a with a gas bubble 230 attaching to its side surface, a pressure due to expansion of the frozen layer 210 is applied to a side surface not accompanied by the gas bubble 230, but the pressure due to expansion of the frozen layer 210 is not applied to the side surface accompanied by the gas bubble 230, because of the presence of the gas bubble 230. Consequently, a crack 225 is formed near the root of this part of the pattern, for example. Thereafter, as illustrated in FIG. 3C, when the frozen layer 210a is thawed and a rinsing process is performed, the cracked protruding portion 201a ends up being removed by the processing liquid.

As described above, where gas bubbles 230 are present in the processing liquid 210, the foreign substances 220 on the substrate 200 can be removed, but there is such a harmful effect that the pattern on the substrate 200 could be collapsed. In consideration of this, in the first embodiment, an explanation will be given of a substrate processing apparatus and a substrate processing method that can remove foreign substances, without collapsing the pattern on the substrate 200.

In the processing liquid 210, gas bubbles are charged with negative electricity. Accordingly, in the first embodiment, the freeze cleaning is performed using a processing liquid with a pH that has been selected to cause a surface of the substrate 200 that should avoid damage to be charged with negative electricity same as gas bubbles and the surfaces of foreign substances to be charged with positive electricity.

Figure 4:
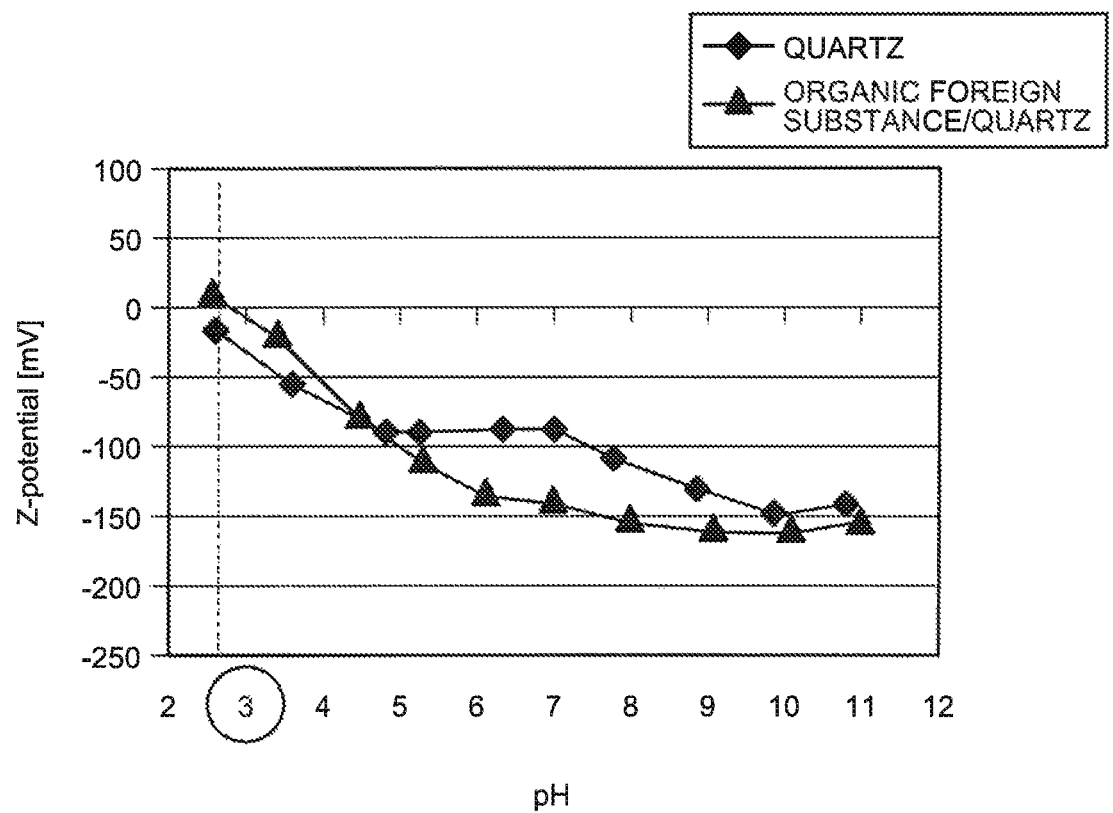
FIG. 4 is a diagram illustrating the relation between pH and zeta potential, on quartz that forms a substrate and on organic foreign substances.

FIG. 4 is a diagram illustrating the relation between pH and zeta potential, on quartz that forms a substrate and on organic foreign substances. In FIG. 4, the horizontal axis indicates the pH of a certain processing liquid, and the vertical axis indicates the surface zeta potential of quartz or foreign substances in this processing liquid. Further, in FIG. 4, rhombic marks indicate the surface zeta potential of quartz, and triangle marks indicate the surface zeta potential of foreign substances attaching to quartz. As illustrated in FIG. 4, the surface zeta potential of foreign substances is negative at a pH of 3 or more, but is positive at a pH of less than 3. On the other hand, the surface zeta potential of quartz is negative at a pH of 3 or more, and is also negative at a pH of less than 3. Here, although FIG. 4 illustrates only a graph down to near a pH of 3, the surface zeta potential of foreign substances is positive, and the surface zeta potential of quartz is negative, at a pH of less than 3. The foreign substances indicated in FIG. 4 are organic foreign substances, for example.

Figure 5:
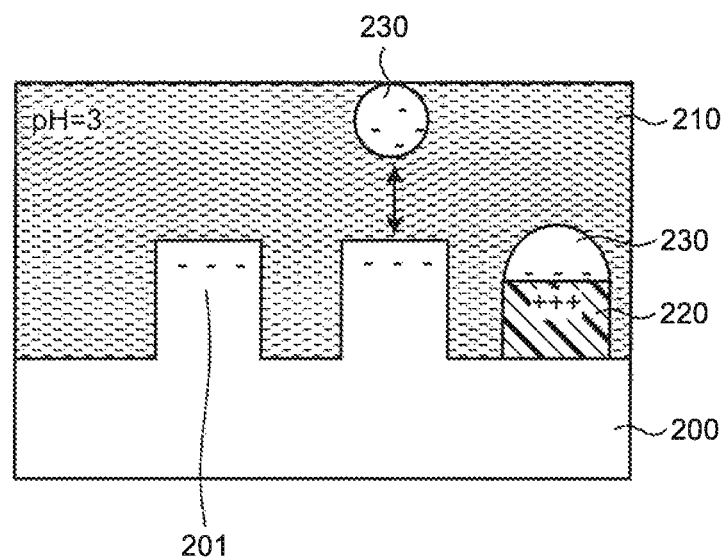
FIG. 5 is a diagram schematically illustrating the relationship between gas bubbles, a foreign substance, and a substrate, in a processing liquid according to a first embodiment.

FIG. 5 is a diagram schematically illustrating the relationship between gas bubbles, a foreign substance, and a substrate, in a processing liquid according to the first embodiment. This example illustrates a case where the substrate 200 is made of quartz, and a processing liquid 210 having a pH of 3 is formed on the substrate 200 including protruding portions 201. As illustrated in FIG. 4, the surface zeta potential of foreign substances 220 is positive, and the surface zeta potential of quartz is negative. Accordingly, where a processing liquid having a pH of less than 3 is used, gas bubbles 230 in the processing liquid are apt to attach to the foreign substances 220, but are not apt to attach to the substrate 200 made of quartz. As a result, when the freeze cleaning is performed in this state, it is possible to prevent collapse of the pattern provided on the substrate 200, while removing the foreign substances 220, as in the model illustrated in FIGS. 2A to 2C.

Figures 6, 7:
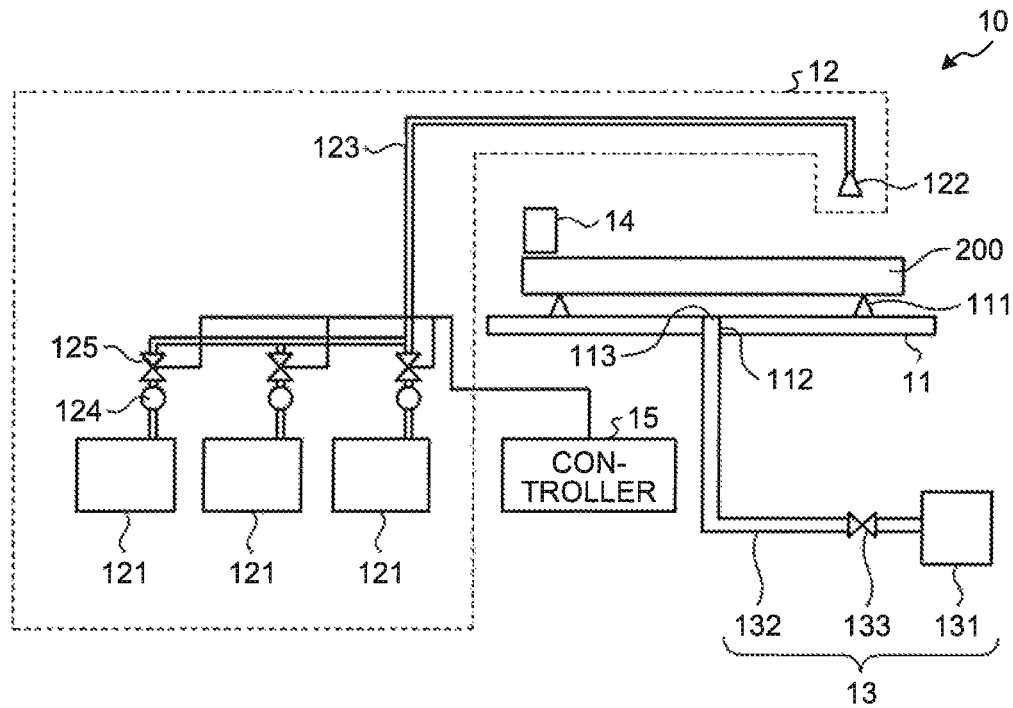
FIG. 6 is a diagram illustrating examples of types of foreign substances and their isoelectric points, together with processing liquids to be used for removing the foreign substances.
FIG. 7 is a diagram schematically illustrating a configuration example of a substrate processing apparatus according to the first embodiment.

FIG. 6 is a diagram illustrating examples of types of foreign substances and their isoelectric points, together with processing liquids to be used for removing the foreign substances. For example, where the foreign substances 220 are made of alumina ($Al_2O_3$), the isoelectric point is at a pH of 7.4 to 9.2. Accordingly, in a processing liquid having a pH higher than this isoelectric point, the surface zeta potential of alumina is negative, and, in a processing liquid having a pH lower than this isoelectric point, the surface zeta potential of alumina is positive. On the other hand, where the substrate 200 is made of quartz, the surface zeta potential of quartz is negative at a pH of 11 or less, as illustrated in FIG. 4. Accordingly, where the foreign substances 220 are made of alumina, a processing liquid having a pH lower than the isoelectric point of alumina is used. This is also true for the other foreign substances 220. For these foreign substances 220, ozonized water, hydrogen peroxide solution, carbonated water, or the like may be used.

Next, an explanation will be given of a substrate processing apparatus for removing foreign substances 220 on a substrate, on the basis of the model described above. FIG. 7 is a diagram schematically illustrating a configuration example of a substrate processing apparatus according to the first embodiment. The substrate processing apparatus 10 according to the first embodiment includes a stage 11, a processing liquid supply section 12, a cooling medium supply section 13, a gas bubble injection part 14, and a controller 15.

The stage 11 is a member for holding the substrate 200 serving as a processing object of the freeze cleaning. The stage 11 corresponds to a substrate holder. The stage 11 is provided with support portions 111 for supporting the substrate 200 at a position higher than the upper surface of the stage 11. The support portions 111 are configured to support the substrate 200 to be separated from the upper surface of the stage 11, so as to enable a cooling medium described later to come into contact with the lower face of the substrate 200 entirely. Further, the stage 11 is provided with a through hole 112, which penetrates the stage 11 in the vertical direction, at about the center in the horizontal direction. The portion of the through hole 112 that intersects with the upper surface of the stage 11 serves as a supply port 113 for the cooling medium, as described later. Here, the stage 11 may be configured to be rotatable about an axis perpendicular to the substrate mounting plane as the center. In this case, each of the support portions 111 is equipped with a stopper that prevents the substrate 200 from shifting in the horizontal direction by the rotation of the stage 11.

The processing liquid supply section 12 is configured to supply a processing liquid to be used for the freeze cleaning. The processing liquid supply section 12 includes a plurality of processing liquid storage parts 121 for storing processing liquids, a nozzle 122 for dropping a processing liquid onto the upper face of the substrate 200, a pipe 123 connecting the nozzle 122 to the processing liquid storage parts 121, pumps 124 for sending the processing liquids from the processing liquid storage parts 121 through the pipe 123 to the nozzle 122, and valves 125 for switching supply of the processing liquids from the respective processing liquid storage parts 121 to the nozzle 122. Here, the pipe 123 connected to the nozzle 122 is branched on the way into portions, which are then connected to the respective processing liquid storage parts 121.

In the first embodiment, a plurality of processing liquid storage parts 121 are provided to store respective processing liquids different in pH. This is because a processing liquid to be used needs to be different in pH, in accordance with the type of foreign substances 220 attaching on the substrate 200, as described above. As the processing liquids stored in the processing liquid storage parts 121, pure water, deionized water, ozonized water, hydrogen peroxide solution, and carbonated water may be used. Here, the hydrogen peroxide solution can be adjusted in pH by changing its concentration.

The cooling medium supply section 13 is configured to supply a cooling medium to cool the substrate 200 down to be equal to or lower than the solidification point of a processing liquid used in the freeze cleaning. The cooling medium supply section 13 includes a cooling medium storage part 131 for storing the cooling medium, a pipe 132 connecting the cooling medium storage part 131 to the through hole 112 of the stage 11, and a valve 133 for switching supply of the cooling medium. As the cooling medium, a gas, such as nitrogen gas, cooled to a temperature lower than the solidification point of the processing liquid, or a similarly cold liquid, such as liquid nitrogen or liquid chlorofluorocarbon, may be used. The end of the pipe 132 on the side connected to the through hole 112 serves as the supply port 113 for the cooling medium. The cooling medium supply section 13 corresponds to a solidifying part.

The gas bubble injection part 14 is configure to inject gas bubbles into a processing liquid formed by dropping a processing liquid onto the substrate 200. For example, the gas bubble injection part 14 may be formed of an ultrasonic wave applying device that applies ultrasonic waves to the processing liquid, a gas dissolving device that dissolves a gas into the processing liquid, an electrolysis device that performs electrolysis to the processing liquid by immersing metal electrodes into the processing liquid, or the like.

The controller 15 is configured to control the operations of the substrate processing apparatus 10 as a whole. In the first embodiment, particularly, the controller 15 includes a processing liquid selecting function for selecting a processing liquid to be used for each substrate 200 to which the freeze cleaning is performed. Specifically, the controller 15 switches the valves 125 of the processing liquid supply section 12, to select a processing liquid having a pH suitable for the surface zeta potential of the substrate 200 to be subjected to the cleaning process. The surface zeta potential of the substrate 200 to be subjected to the cleaning process is determined by, for example, performing a nondestructive composition analysis, such as a fluorescence X-ray analysis method, to foreign substances 220 attaching to the surface of the substrate 200. For example, where many organic foreign substances 220 are attaching, the controller 15 selects hydrogen peroxide solution having a pH of less than 3. Where many alumina foreign substances 220 are attaching, the controller 15 selects carbonated water having a pH of 5.7.

Next, an explanation will be given of a substrate processing method in the substrate processing apparatus described above. FIG. 8 is a flowchart illustrating an example of the sequence of a substrate processing method according to the first embodiment. First, before the freeze cleaning, a hydrophilization treatment is performed to the surface of the substrate 200 serving as a processing object (step S11). The hydrophilization treatment is performed by irradiating the surface of the substrate 200 with ultraviolet (UV) light, for example. Consequently, the surface of the substrate 200 becomes easier to be wetted with a processing liquid used for the freeze cleaning. Then, the substrate 200 subjected to the hydrophilization treatment is held on the stage 11.

Then, a processing liquid is selected in accordance with the substrate 200 to be processed (step S12). For example, where many organic foreign substances 220 are present on the substrate 200 to be processed, hydrogen peroxide solution is selected. Where many alumina foreign substances are present on the substrate to be processed, carbonated water is selected. The controller 15 controls the valves 125 to open one of the valves 125 for the specific processing liquid storage part 121 containing this selected processing liquid, and to close the valves 125 for the other processing liquid storage parts 121.

Thereafter, the selected processing liquid is supplied by the corresponding pump 124 through the pipe 123 and is delivered from the nozzle 122 onto the substrate 200, and a processing liquid is thereby formed on the substrate 200 (step S13). At this time, if the stage 11 is rotated about an axis perpendicular to the substrate mounting plane as the center, the processing liquid supplied on the substrate 200 can be substantially uniformly spread all over the substrate 200 to form the processing liquid.

Then, gas bubbles are injected into the processing liquid by the gas bubble injection part 14 (step S14). Gas bubbles are injected into the processing liquid, for example, by applying ultrasonic waves to the processing liquid, by dissolving gas into the processing liquid, or by immersing metal electrodes into the processing liquid to perform electrolysis.

At this time, since the processing liquid used here is a processing liquid having a pH lower than the pH corresponding to the isoelectric point of foreign substances attaching to the substrate 200, the injected gas bubbles can attach to the foreign substances, but can hardly attach to the substrate 200 or the pattern formed on the substrate 200.

Thereafter, a cooling medium is supplied from the cooling medium supply section 13 through the pipe 132 to the supply port 113 of the stage 11. The cooling medium is delivered from the supply port 113 at the center of the stage 11, and flows toward the outer periphery of the substrate 200 through the gap between the lower face of the substrate 200 and the upper surface of the stage 11. At this time, as the cooling medium comes into contact with the lower face of the substrate 200, the substrate 200 is cooled from the lower face side. Then, when the temperature on the upper face side of the substrate 200 becomes a temperature equal to or lower than the solidification point of the processing liquid, the processing liquid is frozen (step S15). The processing liquid is frozen in order from the part in contact with the substrate 200. During this freezing, cracks are generated in foreign substances by gas bubbles attaching to the foreign substances.

After the processing liquid is frozen, the valve 133 is closed to stop supply of the cooling medium from the cooling medium supply section 13. Further, the processing liquid is thawed, and a rinsing process is performed, by supplying a processing liquid from the processing liquid supply section 12 through the nozzle 122 onto the upper face of the substrate 200 (step S16). The thawing of the processing liquid and the rinsing process may be performed after the processing liquid is frozen over the entire film thickness, or after the processing liquid is frozen by a predetermined thickness from the boundary with the substrate 200, such as a thickness of about 100 nm. Consequently, as illustrated in FIGS. 2A to 2C, the foreign substances 220 on the substrate are removed by cracks 225 generated by introducing the gas bubbles 230 and performing the freezing. However, as the gas bubbles 230 do not attach to the pattern on the substrate 200, the pattern can be prevented from being collapsed.

Thereafter, the substrate 200 is dried (step S17), and the freezing process for the substrate 200 ends.

It should be noted that, although the freeze cleaning is performed only once in the above explanation, the freeze cleaning may be performed repeatedly a plurality of times. Where the freeze cleaning is performed a plurality of times, the type of the processing liquid to be used for cleaning may be changed. In this case, different types of foreign substances on the substrate 200 can be removed.

In the first embodiment, a processing liquid having a pH selected in accordance with the isoelectric point of foreign substances on the substrate 200 is supplied onto the substrate 200 to form a processing liquid, and then the freeze cleaning is performed after gas bubbles are injected into the processing liquid. Consequently, the gas bubbles injected into the processing liquid are charged with negative electricity, and are apt to attach to the foreign substances, but are not apt to attach to the substrate 200 or the pattern formed on the substrate 200. As a result, in freezing, cracks can be easily generated in the foreign substances by a pressure applied to gas bubbles attaching to the foreign substances. Thus, when the processing liquid is thawed, the foreign substances can be removed while the pattern is prevented from being collapsed.

Further, where the freeze cleaning is performed a plurality of times, organic foreign substances and inorganic foreign substances can be removed by using processing liquids different in pH. This makes it possible to keep the upper face of the substrate 200 clean.

Second Embodiment

Figure 9A:
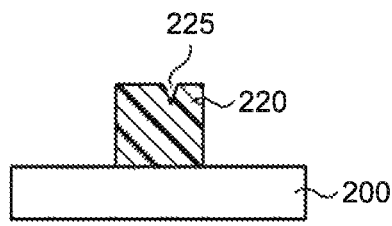
FIGS. 9A to 9E are diagrams schematically illustrating a manner of the freeze cleaning, in a case where cracks are present in foreign substances.
Figure 9B:
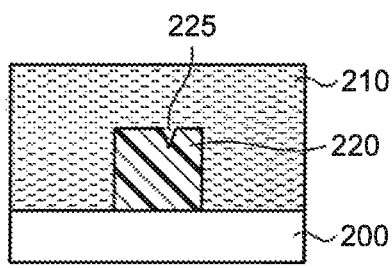

FIGS. 9A to 9E are diagrams schematically illustrating a manner of the freeze cleaning, in a case where cracks are present in foreign substances. FIGS. 10A to 10E are diagrams schematically illustrating a manner of the freeze cleaning, in a case where voids are present in foreign substances. As illustrated in FIGS. 9A and 10A, the freeze cleaning object to be processed here is a substrate 200 accompanied by foreign substances 220 having cracks 225 on their surfaces or foreign substances 220 having voids 226 inside. Then, as illustrated in FIGS. 9B and 10B, a processing liquid is supplied onto this substrate 200, and a processing liquid 210 is thereby formed. At this time, the processing liquid 210 fills the inside of the cracks 225 or voids 226 of the foreign substances 220.

Figure 9C:
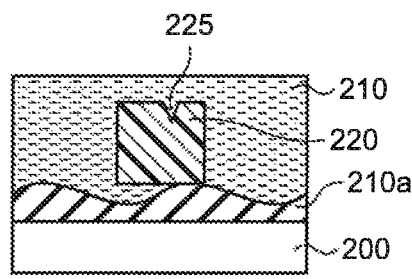
Figure 9D:
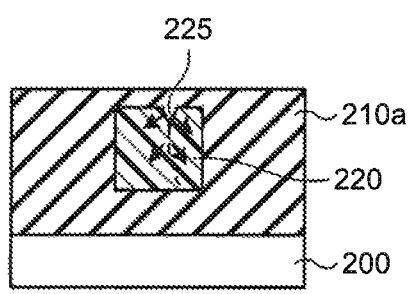
Figure 10A:
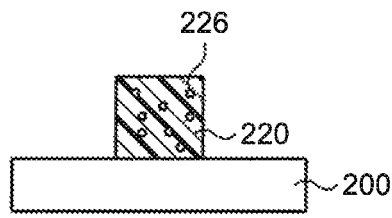
FIGS. 10A to 10E are diagrams schematically illustrating a manner of the freeze cleaning, in a case where voids are present in foreign substances.
Figure 10B:
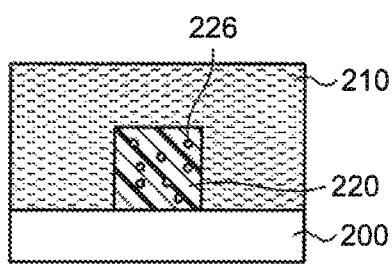
Figure 10C:
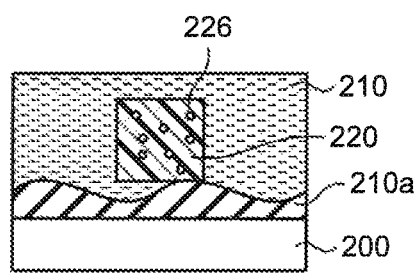
Figure 10D:
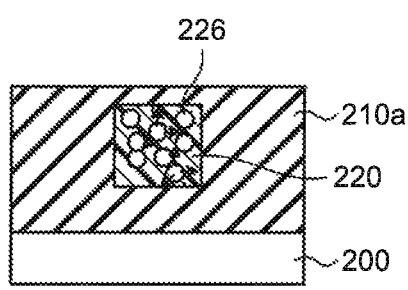

Thereafter, as illustrated in FIGS. 9C and 10C, a cooling medium is supplied to the lower face of the substrate 200 to cool the processing liquid 210 through the substrate 200, and a frozen layer 210a is thereby formed. As illustrated in FIGS. 9D and 10D, the processing liquid 210 is frozen to a position higher than the upper surfaces of the foreign substances 220. At this time, the volume of the processing liquid intruding in the cracks 225 or voids 226 is expanded by freezing, and a force due to this expansion acts to divide each of the foreign substances 220 into pieces.

Figure 9E:
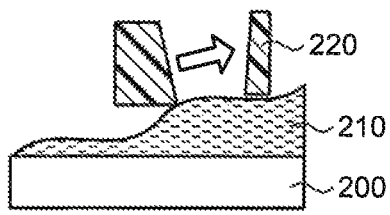
Figure 10E:
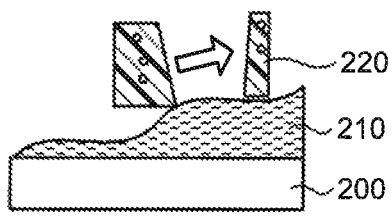

Then, as illustrated in FIGS. 9E and 10E, a processing liquid is supplied onto the processing liquid 210 including the frozen layer 210a to thaw the frozen layer 210a, and to perform a rinsing process. Consequently, the foreign substances 220 are each divided into pieces, and are removed from the substrate 200.

As described above, where foreign substances 220 on the substrate 200 have cracks 225 on their surfaces or voids 226 inside, the foreign substances 220 are each divided into small pieces by the freeze cleaning. This increases the probability of the foreign substances 220 being removed, as compared to the foreign substances 220 with the undivided size. Accordingly, in the second embodiment, before the freezing process, a fracturing facilitation treatment is performed so that large foreign substances can be easily fractured into pieces in the freeze cleaning.

FIG. 11 is a flowchart illustrating an example of the sequence of a substrate processing method according to the second embodiment. Here, a substrate processing apparatus used in the second embodiment may be a substrate processing apparatus for performing an ordinary freezing process. For example, a configuration used here is formed such that, in the substrate processing apparatus illustrated in FIG. 7, the gas bubble injection part 14 is excluded, and the processing liquid supply section 12 is formed only of a processing liquid storage part 121 that stores pure water.

First, a fracturing facilitation treatment for foreign substances on the substrate 200 is performed (step S31). As the fracturing facilitation treatment, a treatment of applying a temperature difference to the foreign substances may be performed.

Figure 12A:
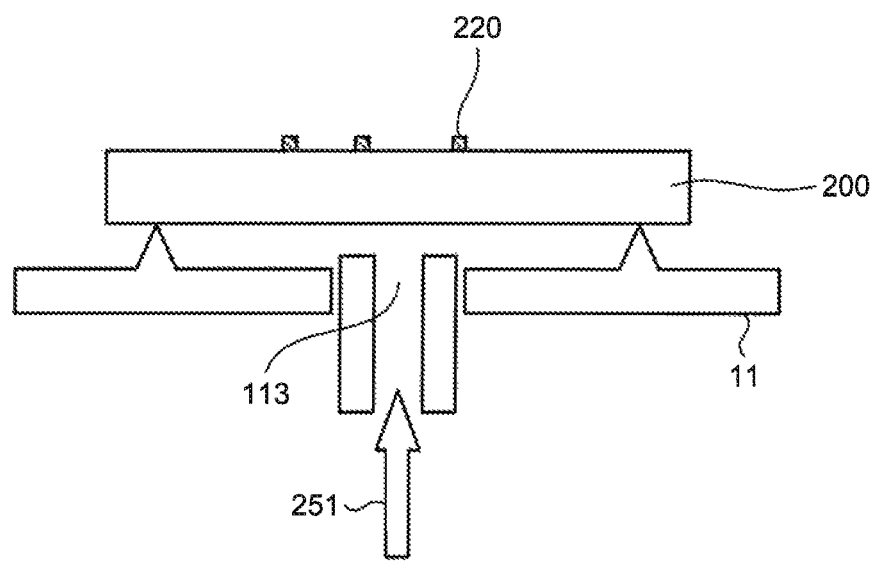
FIGS. 12A and 12B are diagrams schematically illustrating an example of a fracturing facilitation treatment that applies a temperature difference to foreign substances.
Figure 12B:
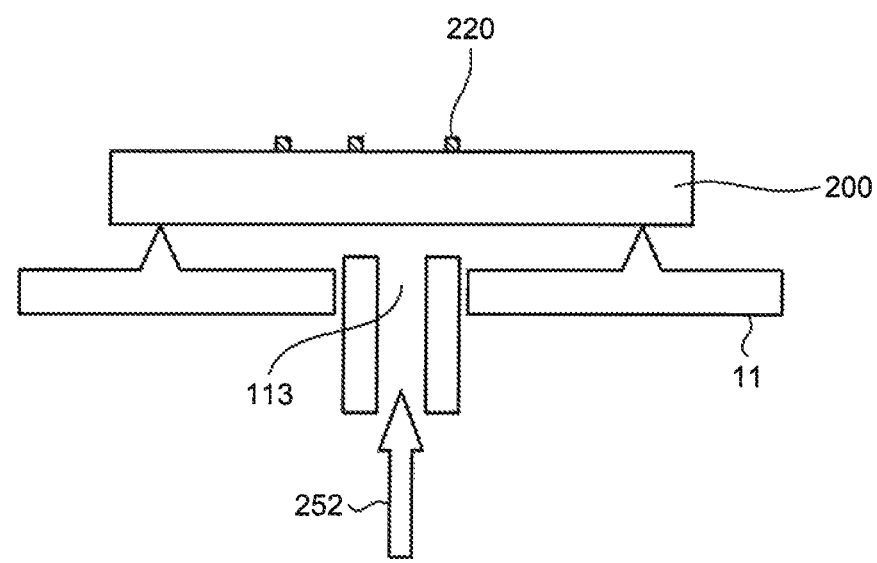

FIGS. 12A and 12B are diagrams schematically illustrating an example of a fracturing facilitation treatment that applies a temperature difference to foreign substances. As illustrated in FIG. 12A, a substrate 200 with foreign substances 220 attaching thereto is held on the stage 11 to have a predetermined distance from the upper surface of the stage 11. Then, a cooling medium 251 is supplied for a predetermined time from the supply port 113 formed at about the center of the stage 11. As the cooling medium 251, for example, a gas, such as nitrogen gas, cooled to a temperature lower than the solidification point of a processing liquid to be used for the freeze cleaning, or a similarly cold liquid, such as liquid nitrogen or liquid chlorofluorocarbon, may be used.

After supply of the cooling medium 251 is stopped, as illustrated in FIG. 12B, a heating medium 252 is supplied for a predetermined time from the supply port 113. The heating medium 252 is nitrogen gas at room temperature, for example. Thereafter, the treatment of FIGS. 12A and 12B may be performed repeatedly. Since the foreign substances 220 on the substrate 200 are placed under severe environment with a large temperature difference as described above, the foreign substances 220 repeat expansion and contraction, and cracks are generated on the surfaces of the foreign substances 220.

Here, the substrate processing apparatus may be provided with a mechanism for applying a temperature difference to the foreign substances 220 as described above. For example, the substrate processing apparatus may have a configuration based on that illustrated in FIG. 7, such that this substrate processing apparatus 10 is further provided with a heating medium storage part and a valve for switching supply of the cooling medium and supply of the heating medium. With this configuration, the fracturing facilitation treatment can be performed by the substrate processing apparatus.

After the fracturing facilitation treatment is performed to the substrate 200, a hydrophilization treatment is performed to the surface of the substrate 200 to be processed (step S32). The hydrophilization treatment is performed by irradiating the surface of the substrate 200 with UV light, for example. Here, the fracturing facilitation treatment for organic foreign substances in step S31 and the hydrophilization treatment in step S32 correspond to pre-treatments.

Thereafter, a processing liquid is formed on the substrate 200 (step S33). The processing liquid intrudes into cracks or voids formed in the foreign substances 220 by the fracturing facilitation treatment.

Thereafter, a cooling medium is supplied to the lower face of the substrate 200 to freeze the processing liquid (step S34). Consequently, a frozen layer 210a is formed from the substrate 200 side. Further, as illustrated in FIGS. 9D and 10D, a force due to expansion of the processing liquid intruding and being frozen in the cracks 225 or voids 226 acts on the foreign substances 220 to divide each of the foreign substances 220 into pieces. Thereafter, the frozen layer 210a is thawed, and a rinsing process is performed (step S35). Consequently, the foreign substances 220 including divided foreign substances are removed from the substrate 200. Lastly, the substrate 200 is dried (step S36), and the processing sequence ends.

Here, the above explanation has been given of a case where the fracturing facilitation treatment is arranged to apply a temperature difference to the foreign substances 220; however, the embodiment is not limited to this case. For example, the fracturing facilitation treatment may be exemplified by a treatment that applies a pressure difference to foreign substances 220, a treatment that performs supercritical drying to foreign substances 220, a treatment that causes a chemical reaction in foreign substances 220, a treatment that applies energy rays to foreign substances 220, or the like. Next, explanations will be given of these examples.

Figure 13A:
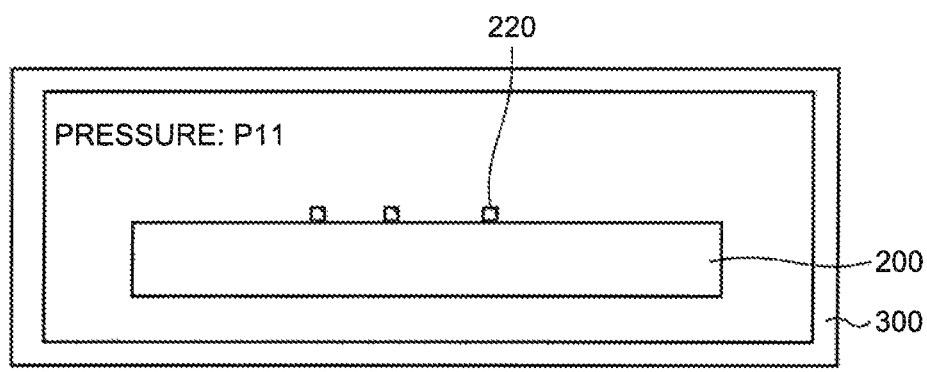
FIGS. 13A and 13B are diagrams schematically illustrating an example of a fracturing facilitation treatment that applies a pressure difference to foreign substances.
Figure 13B:
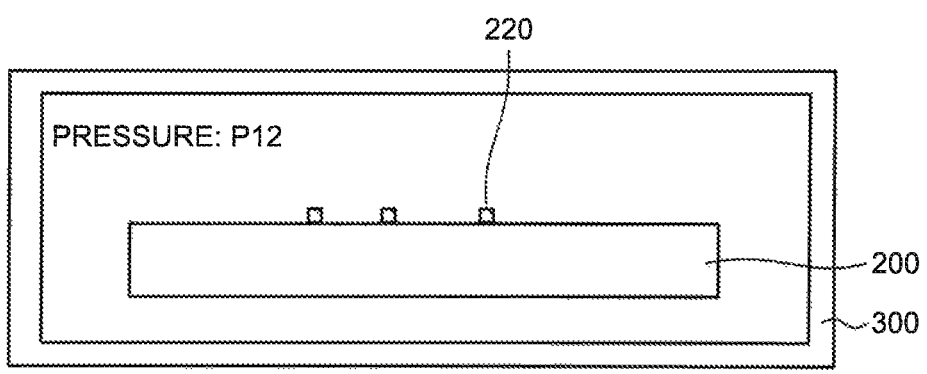

FIGS. 13A and 13B are diagrams schematically illustrating an example of a fracturing facilitation treatment that applies a pressure difference to foreign substances. As illustrated in FIG. 13A, a substrate 200 with foreign substances 220 attaching thereto is placed in a high pressure container 300. Then, nitrogen gas, oxidizing gas, or the like is injected into the high pressure container 300, until the inner pressure reaches a first pressure P11 higher than the atmospheric pressure, and the first pressure P11 is maintained for a predetermined time. Consequently, the inside of the high pressure container 300 is set in a pressurized state. Then, as illustrated in FIG. 13B, the pressure inside the high pressure container 300 is reduced down to a second pressure P12 lower than the first pressure P11, and the second pressure P12 is maintained for a predetermined time. For example, the pressure inside the high pressure container 300 is reduced down to the atmospheric pressure. Thereafter, the treatment of FIG. 13A and FIG. 13B may be performed repeatedly. Since the foreign substances 220 on the substrate 200 are placed under severe environment with a large pressure difference as described above, cracks are generated on the surfaces of the foreign substances 220.

Figure 14A:
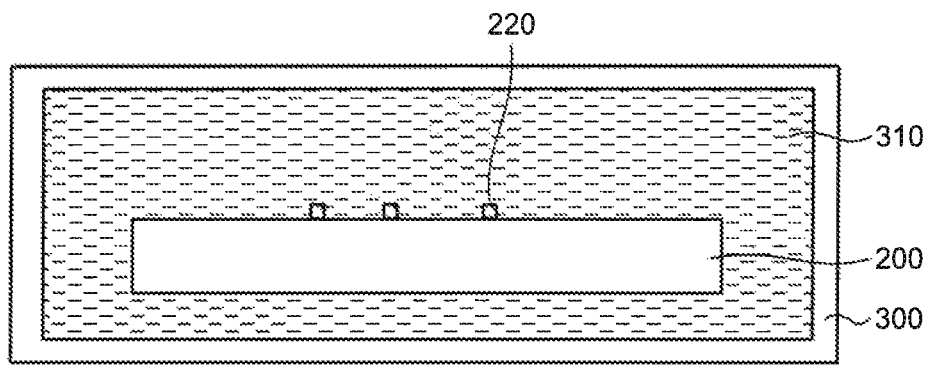
FIGS. 14A to 14C are diagrams schematically illustrating an example of a fracturing facilitation treatment that performs supercritical drying to foreign substances.
Figure 14B:
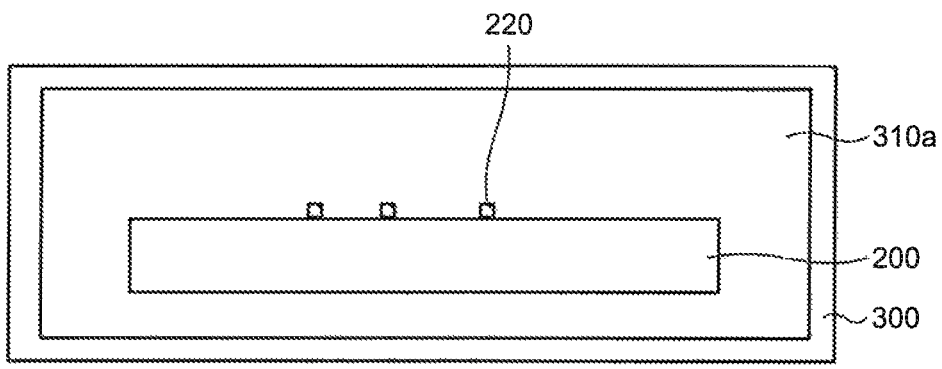
Figure 14C:
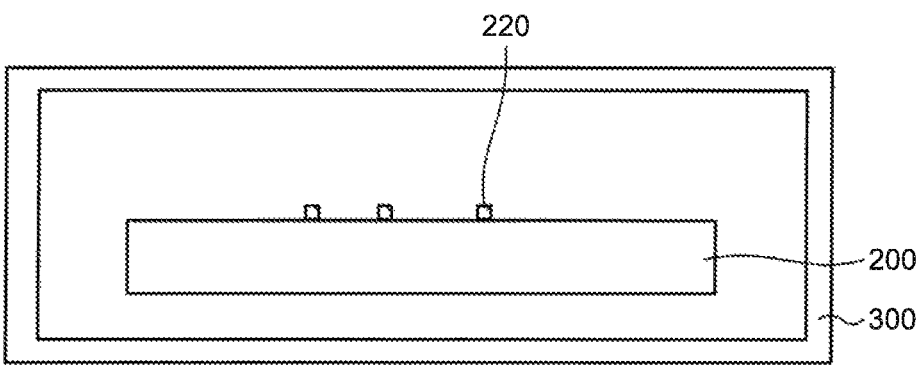
Figure 15A:
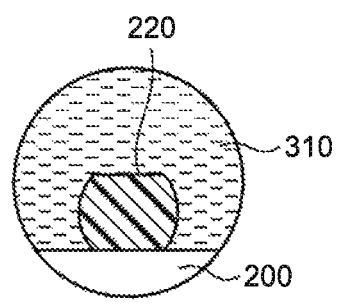
FIGS. 15A and 15B are diagrams schematically illustrating a manner of a foreign substance in a supercritical drying treatment.
Figure 15B:
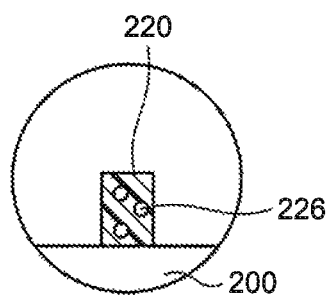

FIGS. 14A to 14C are diagrams schematically illustrating an example of a fracturing facilitation treatment that performs supercritical drying to foreign substances. FIGS. 15A and 15B are diagrams schematically illustrating a manner of a foreign substance in a supercritical drying treatment. As illustrated in FIG. 14A, a substrate 200 with foreign substances 220 attaching thereto is placed in a high pressure container 300. Then, the inside of the high pressure container 300 is filled up with a processing liquid 310. The processing liquid 310 may be exemplified by pure water or the like. Then, the processing liquid 310 inside the high pressure container 300 is pressurized. Consequently, as illustrated in FIG. 15A, a state is formed where the processing liquid 310 is infiltrating into the foreign substances 220 attaching to the substrate 200.

Thereafter, as illustrated in FIG. 14B, temperature and pressure conditions are set to bring the processing liquid 310 inside the high pressure container 300 into a supercritical state 310a. Consequently, the processing liquid 310 inside the high pressure container 300 comes into the supercritical state 310a, and the processing liquid 310 infiltrating in the foreign substances 220 changes into a supercritical fluid. Thereafter, as illustrated in FIG. 14C, the pressure inside the high pressure container 300 is reduced down to the atmospheric pressure, and thus the processing liquid 310 in the foreign substances 220 is released. Consequently, as illustrated in FIG. 15B, voids 226 are formed in the foreign substances 220 as traces from which the processing liquid 310 has been released.

Figure 16A:
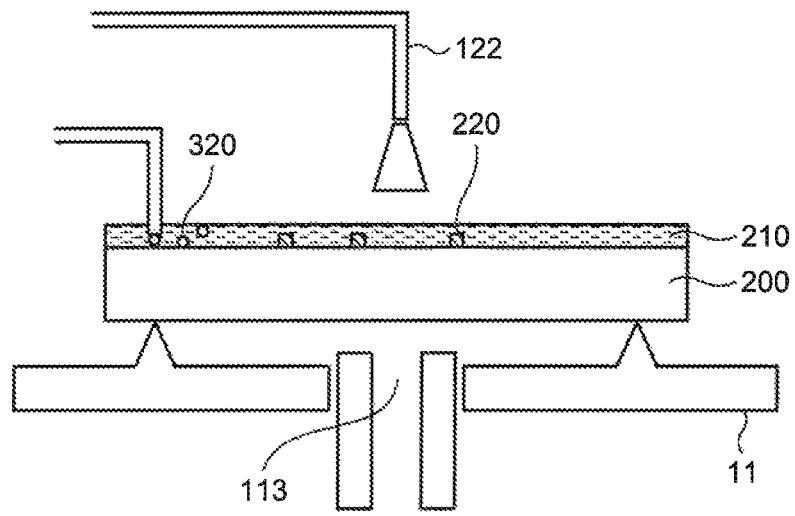
FIGS. 16A and 16B are diagrams schematically illustrating an example of a fracturing facilitation treatment that causes a chemical reaction in foreign substances.
Figure 16B:
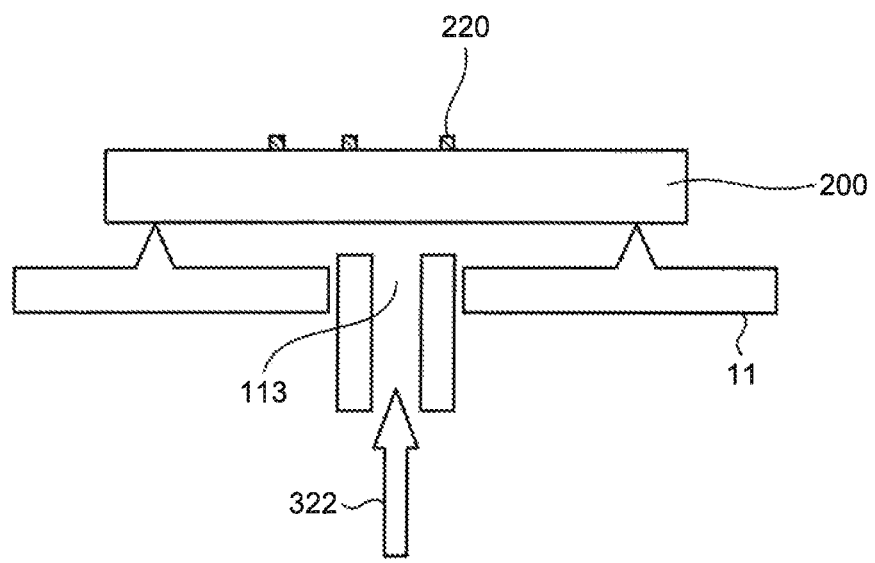
Figure 17A:
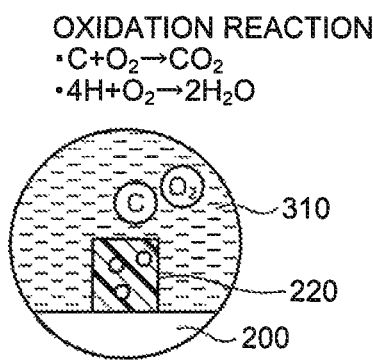
FIGS. 17A and 17B are diagrams schematically illustrating a manner of a foreign substance being subjected to a chemical reaction.
Figure 17B:
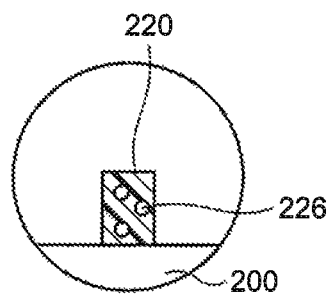

FIGS. 16A and 16B are diagrams schematically illustrating an example of a fracturing facilitation treatment that causes a chemical reaction in foreign substances. FIGS. 17A and 17B are diagrams schematically illustrating a manner of a foreign substance being subjected to a chemical reaction. As illustrated in FIG. 16A, a substrate 200 with foreign substances 220 attaching thereto is held on the stage 11 to have a predetermined distance from the upper surface of the stage 11. Then, a processing liquid is supplied onto the substrate 200, and a processing liquid 210 is thereby formed. The processing liquid is deionized water, for example. Thereafter, an oxidizing agent 320 is injected into the processing liquid 210. The oxidizing agent 320 is not limited specifically, as long as the agent can react with carbon that forms organic foreign substances 220, and generate a reaction product having a vapor pressure. The oxidizing agent may be exemplified by oxygen, fluorine-based gas, or the like Consequently, a reaction expressed by the following formulas (1) and (2) is caused in organic foreign substances 220 in the processing liquid 210.

$$C + O_2 \rightarrow CO_2 \quad (1)$$

$$4H + O_2 \rightarrow 2H_2O \quad (2)$$

Carbon in the foreign substances 220 is turned into carbon dioxide and is released from the foreign substances 220. Thus, as illustrated in FIG. 17A, the foreign substances 220 come into a state to allow water to easily infiltrate therein.

Thereafter, as illustrated in FIG. 16B, a nitrogen gas 322 at room temperature is supplied from the supply port 113 at about the center of the stage 11, and the substrate 200 is thereby dried. Consequently, as illustrated in FIG. 178, water in the foreign substances 220 is released, and voids 226 are formed in the foreign substances 220.

Here, the substrate processing apparatus may be provided with a mechanism for causing a chemical reaction in the foreign substances 220 as described above. For example, the substrate processing apparatus may have a configuration based on that illustrated in FIG. 7, such that this substrate processing apparatus 10 is further provided with an oxidizing agent supply section, a drying gas storage part that stores a gas for drying the substrate 200, and a valve for switching supply of the cooling medium and supply of the drying gas. With this configuration, the fracturing facilitation treatment can be performed by the substrate processing apparatus 10.

Figure 18:
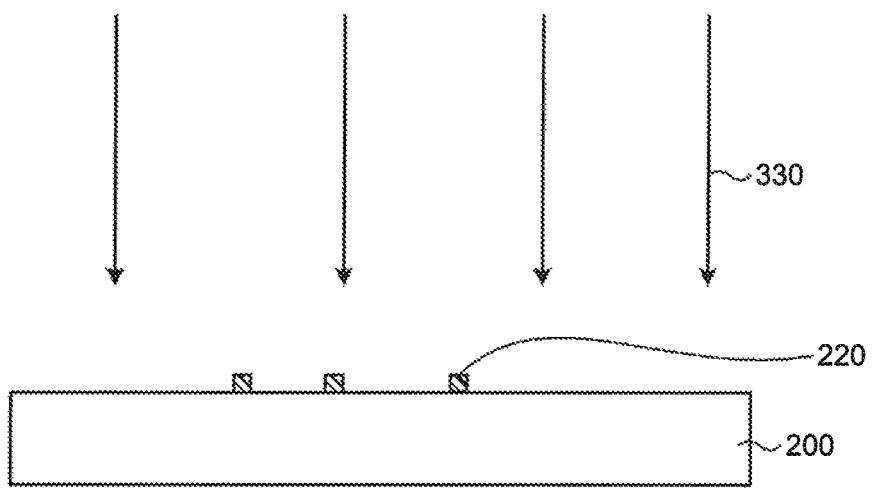
FIG. 18 is a diagram illustrating an example of a fracturing facilitation treatment that applies energy rays to foreign substances.

FIG. 18 is a diagram illustrating an example of a fracturing facilitation treatment that applies energy rays to foreign substances. As illustrated in FIG. 18, foreign substances 220 attaching to a substrate 200 is irradiated with energy rays 330. For example, the energy rays 330 may be exemplified by UV light, X-rays, electron rays, or the like. Here, the type of the energy rays 330 and/or the wavelength of the energy rays 330 to be used are different, depending on the type of the foreign substances 220. The energy rays are selected to have a wavelength that can be easily absorbed by the foreign substances 220. When the foreign substances 220 are irradiated with the energy rays 330, the atomic bonding state in the foreign substances 220 is changed, and cracks are thereby generated.

In the second embodiment, cracks 225 or voids 226 are generated in foreign substances 220 on the substrate 200, and then the freezing process is performed. Consequently, the foreign substances 220 are each divided into pieces by expansion of a processing liquid intruding in the cracks 225 or voids 226 and being frozen. This makes it possible to remove even large foreign substances 220 from the substrate 200.

Third Embodiment

Figure 19:
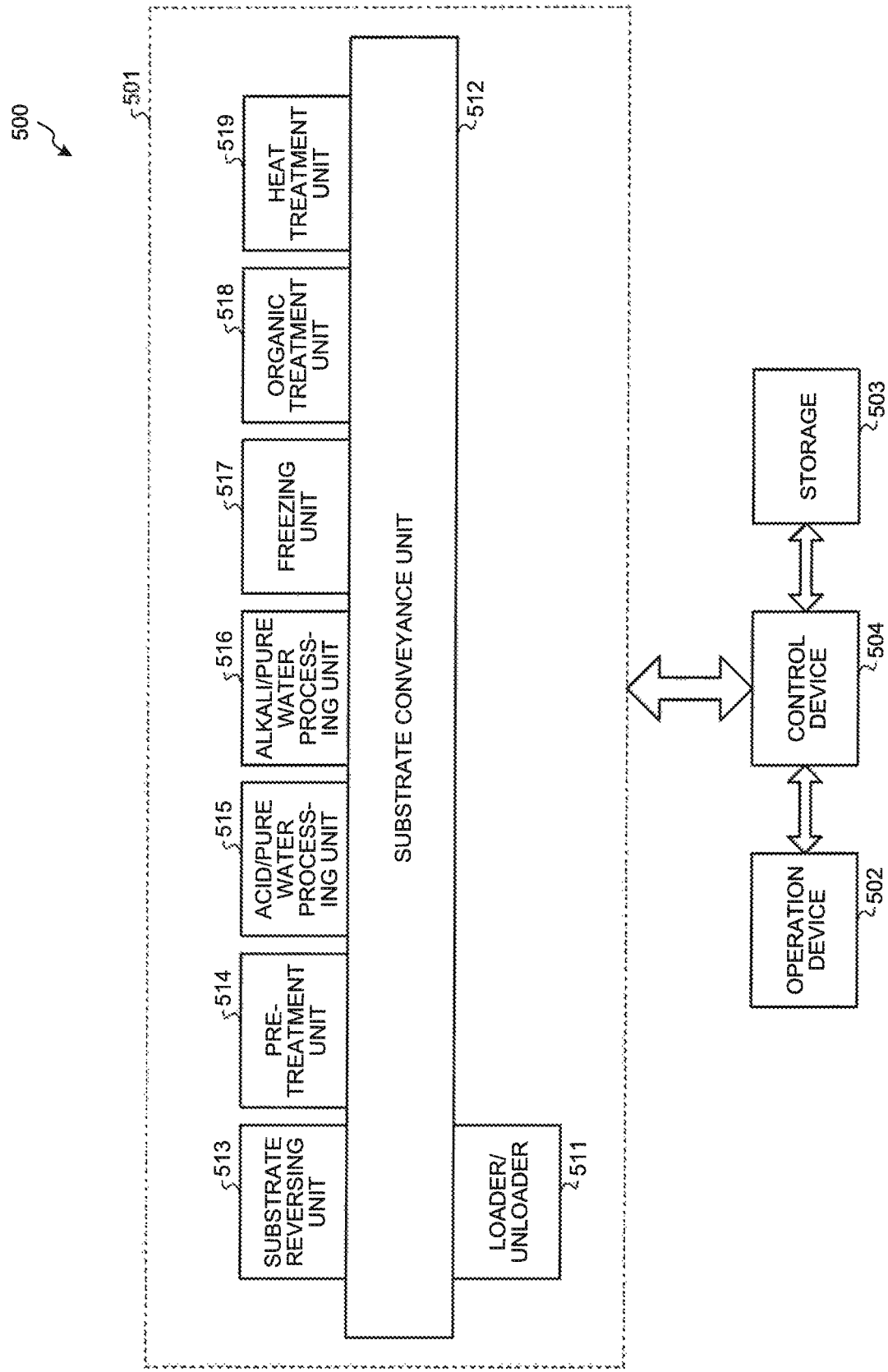
FIG. 19 is a diagram schematically illustrating a configuration example of a substrate processing system according to a third embodiment.

FIG. 19 is a diagram schematically illustrating a configuration example of a substrate processing system according to a third embodiment. The substrate processing system 500 illustrated as an example of a production system includes a processing section 501, an operation device 502, a storage 503, and a control device 504.

The processing section 501 is a composite processing apparatus for cleaning a substrate 200. The processing section 501 includes, for example, a loader/unloader 511, a substrate conveyer 512, a substrate reversing unit 513, a pre-treatment unit 514, an acid/pure water processing unit 515, an alkali/pure water processing unit 516, a freezing unit 517, an organic treatment unit 518, and a heat treatment unit 519. A pre-treatment prior to a cleaning process is performed in the pre-treatment unit 514, the cleaning process is performed in the acid/pure water processing unit 515, the alkali/pure water processing unit 516, and the freezing unit 517, and a post-treatment is performed in the organic treatment unit 518 and the heat treatment unit 519.

The loader/unloader 511 is arranged to load a substrate 200 before cleaning into the processing section 501, and to unload the substrate after cleaning from the processing section 503.

The substrate conveyer 512 includes transfer devices (not illustrated). The substrate conveyer 512 is arranged to convey substrates 200 loaded in the processing section 501, inside the processing section 501. The upper faces of substrates 200 carried out of the acid/pure water processing unit 515, the alkali/pure water processing unit 516, and the freezing unit 517 are entirely covered with a liquid (pure water), and the substrates 200 are transferred in this state to the respective next units.

The substrate reversing unit 513 is arranged to reverse each substrate 200. Each substrate 200 is preferably clean on its frontside and backside. Accordingly, the substrate reversing unit 513 includes a reversing mechanism that switches the face to be cleaned of the substrate 200 to either of the frontside and backside, when the frontside and backside are to be cleaned. The substrate reversing unit 513 corresponds to a substrate reversing apparatus.

Figure 20A:
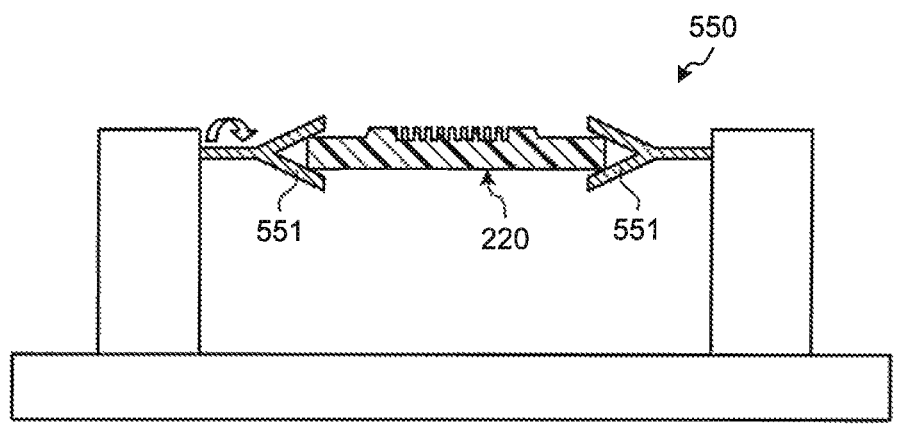
FIGS. 20A and 20B are diagrams schematically illustrating a configuration example of a reversing mechanism.
Figure 20B:
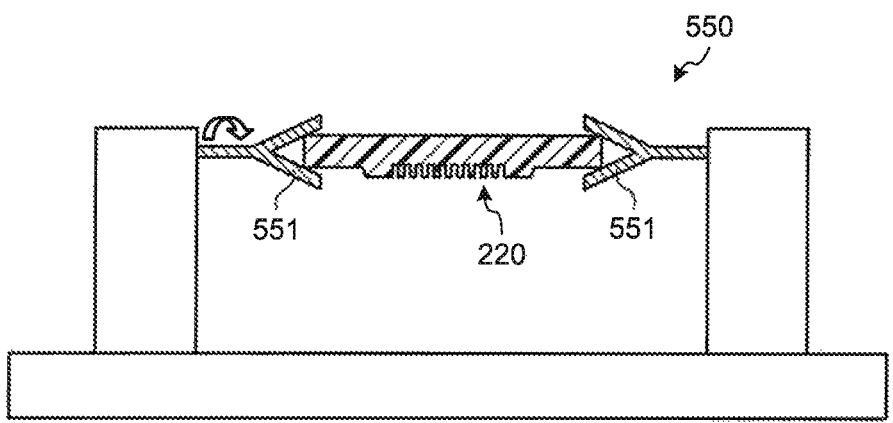

FIGS. 20A and 20B are diagrams schematically illustrating a configuration example of a reversing mechanism. In FIGS. 20A and 208, in order to distinguish the frontside and backside of a substrate 200, the substrate 200 is exemplified by a template. Here, FIG. 20A illustrates a case where the substrate 200 is placed with its frontside oriented upward, and FIG. 20B illustrates a case where the substrate 200 is placed with its backside oriented upward. The reversing mechanism 550 includes support portions 551 arranged to support opposite lateral sides of the substrate 200. The support portions 551 are configured to be rotatable about a predetermined direction as the center, which is parallel with the substrate plane of the substrate 200. The reversing mechanism 550 reverses the substrate 200 supported by the support portions 551, as illustrated in FIG. 20B, by rotating the support portions 551.

The pre-treatment unit 514 is arranged to perform a pre-treatment to the substrate 200. For example, the pre-treatment is a hydrophilization treatment. In this case, the pre-treatment unit 514 includes a stage for holding the substrate 200, and a light source for irradiating the substrate held on the stage with UV light. Further, as the pre-treatment, the fracturing facilitation treatment for foreign substances described in the second embodiment may be performed. The pre-treatment unit 154 corresponds to a pre-treatment apparatus.

The acid/pure water processing unit 515 is arranged to perform, to the substrate 200, a cleaning process using an acid solution and pure water (which will be referred to as "acid/pure water process", hereinafter), or a cleaning process using pure water (which will be referred to as "pure water process", hereinafter). The acid/pure water processing unit 515 includes an acid processing part for performing a cleaning process using an acid solution, and a pure water processing part for performing cleaning using pure water. In the acid/pure water process, cleaning using an acid solution is performed, and then cleaning using pure water is performed. At this time, the pure water may contain an additive or the like for resistivity control or the like. The acid solution may be exemplified by sulfuric acid solution, a mixed solution of sulfuric acid and hydrogen peroxide solution, hydrogen peroxide solution, ozonized water, carbonated water, or the like. Further, after the cleaning is completed, the upper face of the substrate 200 is entirely covered with pure water by the pure water processing part. Accordingly, the substrate 200 is transferred from the acid/pure water processing unit 515 to the next unit, in a state where the upper face of the substrate 200 is entirely covered with pure water.

The alkali/pure water processing unit 516 is arranged to perform, to the substrate 200, a cleaning process using an alkali solution and pure water (which will be referred to as "alkali/pure water process", hereinafter), or the pure water process. The alkali/pure water processing unit 516 includes an alkali processing part for performing a cleaning process using an alkali solution, and a pure water processing part for performing cleaning using pure water. In the alkali/pure water process, cleaning using an alkali solution is performed, and then cleaning using pure water is performed. At this time, the pure water may contain an additive or the like for resistivity control or the like. The alkali solution may be exemplified by aqueous ammonia, a mixed solution (SC-1) of aqueous ammonia and hydrogen peroxide solution, potassium hydroxide solution, tetramethyl ammonium hydroxide (TMAH) solution, or the like. Further, after the cleaning is completed, the upper face of the substrate 200 is entirely covered with pure water by the pure water processing part. Accordingly, the substrate 200 is transferred from the alkali/pure water processing unit 516 to the next unit, in a state where the upper face of the substrate 200 is entirely covered with pure water.

Here, a case where only the pure water process is performed in the acid/pure water processing unit 515 and the alkali/pure water processing unit 516 includes not only a case where cleaning is performed by using pure water, but also a case where cleaning is performed by using pure water to which a surfactant, a slight amount of acid or alkali, and/or the like have been added. The acid/pure water processing unit 515 and the alkali/pure water processing unit 516 correspond to a cleaning unit.

The freezing unit 517 is arranged to perform a freezing process to the substrate 200. The freezing unit 517 corresponds to a freezing apparatus. In the freezing process, a processing liquid is formed on the upper face of the substrate 200, and the processing liquid is frozen to form a frozen layer by using a cooling medium having a temperature lower than the solidification point of the processing liquid. Then, this frozen layer is melted, and the processing liquid is removed. The freezing process can be of any type, as long as the process includes such a processing sequence mentioned above. For example, the freezing process described in the first or second embodiment may be used.

The organic treatment unit 518 is arranged to perform an organic treatment to the substrate 200. For example, the organic treatment may be exemplified by a treatment that supplies an organic solvent of isopropyl alcohol or the like onto the upper face (cleaning object face) of the substrate 200 and then performs drying to the substrate 200; or the like. With this treatment, a slight amount of moisture remaining on the upper face of the substrate 200 can be removed.

The heat treatment unit 519 is arranged to perform a heat treatment to the substrate 200. The heat treatment is performed to remove a slight amount of moisture remaining on the upper face of the substrate 200. Accordingly, the heat treatment preferably heats the substrate 200 to a temperature of 100° C. or more.

The operation device 502 includes, for example, a touch panel for performing input operations or the like, a display for visualizing and displaying operational status, and so forth, for operators to manage the substrate processing system 500.

The storage 503 stores, for example, control recipes or the like to implement cleaning processes to substrates 200.

The control device 504 includes, for example, a microprocessor. The control device 504 reads a control recipe from the storage 503, on the basis of an instruction from the operation device 502. The control device 504 controls the processing section 501 in accordance with the control recipe.

Next, an explanation will be given of a substrate processing method in the substrate processing system 500 described above. There is a case where a face of a substrate 200 on which a pattern is arranged (which will be referred to as "pattern arrangement face", hereinafter) is contaminated by the freezing unit 517 of the substrate processing system 500. It is thought that, in general, this contamination is caused in a case where a contaminated cooling medium is used or in a case where ice or frost generated on the substrate 200 due to cooling causes impurities in the atmosphere to attach thereto. Accordingly, the contamination risk is high on a face to be in contact with the cooling medium. Particularly, contamination to the pattern arrangement face has to be prevented more strictly than contamination to the backside. For example, in the first and second embodiments, the cooling medium is supplied from the backside side of the substrate 200, and thus the contamination risk is lower, as compared with a case where a cooling medium is supplied from the frontside side. The processing method in the substrate processing system 500 is different, depending on the degree of the contamination risk to the pattern arrangement face of the substrate 200 in the substrate processing apparatus, as described above. Further, the processing method in the substrate processing system 500 is different, also depending on whether the substrate processing apparatus is provided with a mechanism for reducing the contamination risk to the face to be in contact with a cooling medium, such as a filtering mechanism, a frost generation preventing mechanism, an environment clean-up mechanism, or the like. Accordingly, next, explanations will be given separately of a case where there is a risk that the pattern arrangement face could be contaminated by the freezing process, and a case where there is no risk of such contamination.

Figure 21:
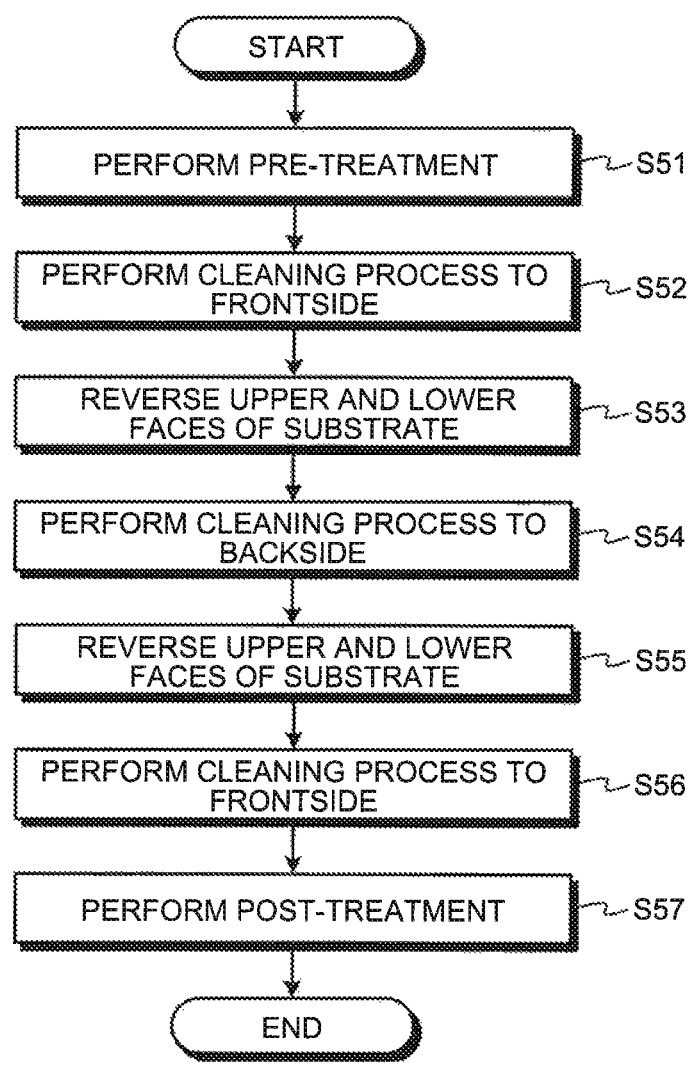
FIG. 21 is a flowchart illustrating an example of an outline of the sequence of a substrate processing method according to the third embodiment, in a case where there is a risk that a pattern arrangement face could be contaminated.

FIG. 21 is a flowchart illustrating an example of an outline of the sequence of a substrate processing method according to the third embodiment, in a case where there is a risk that the pattern arrangement face could be contaminated. First, in a state where the frontside of a substrate 200 is on the upper side, a pre-treatment is performed to the frontside that is now the upper face of the substrate 200 (step S51). As the pre-treatment, there is a hydrophilization treatment that irradiates the frontside, i.e., the upper face of the substrate 200 with UV light or Vacuum Ultra Violet (VUV) light. Here, this irradiation treatment with UV light or VUV light may be replaced with an acid treatment.

Then, a cleaning process is performed to the frontside of the substrate 200 (step S52). As the cleaning process, at least one or more processes of the acid/pure water process, the alkali/pure water process, the pure water process, and the freezing process are performed.

Thereafter, the substrate 200 is reversed (step S53), to set a state where the frontside of the substrate 200 is on the lower side, and a cleaning process is performed to the backside that is now the upper face of the substrate 200 (step S54). As the cleaning process, at least one or more processes of the acid/pure water process, the alkali/pure water process, the pure water process, and the freezing process are performed.

Then, the substrate 200 is reversed (step S55), to set a state where the frontside of the substrate 200 is on the upper side, and a cleaning process is performed to the frontside that is now the upper face of the substrate 200 (step S56). As the cleaning process, at least one or more processes of the acid/pure water process, the alkali/pure water process, and the pure water process are performed.

Thereafter, in a state where the frontside of the substrate 200 is on the upper side, a post-treatment is performed to the upper face of the substrate 200 (step S57). As the post-treatment, at least one or more treatments of the organic treatment and the heat treatment are performed. Here, the post-treatment is not performed, as the case may be. As a result, the processing sequence ends.

Figure 22:
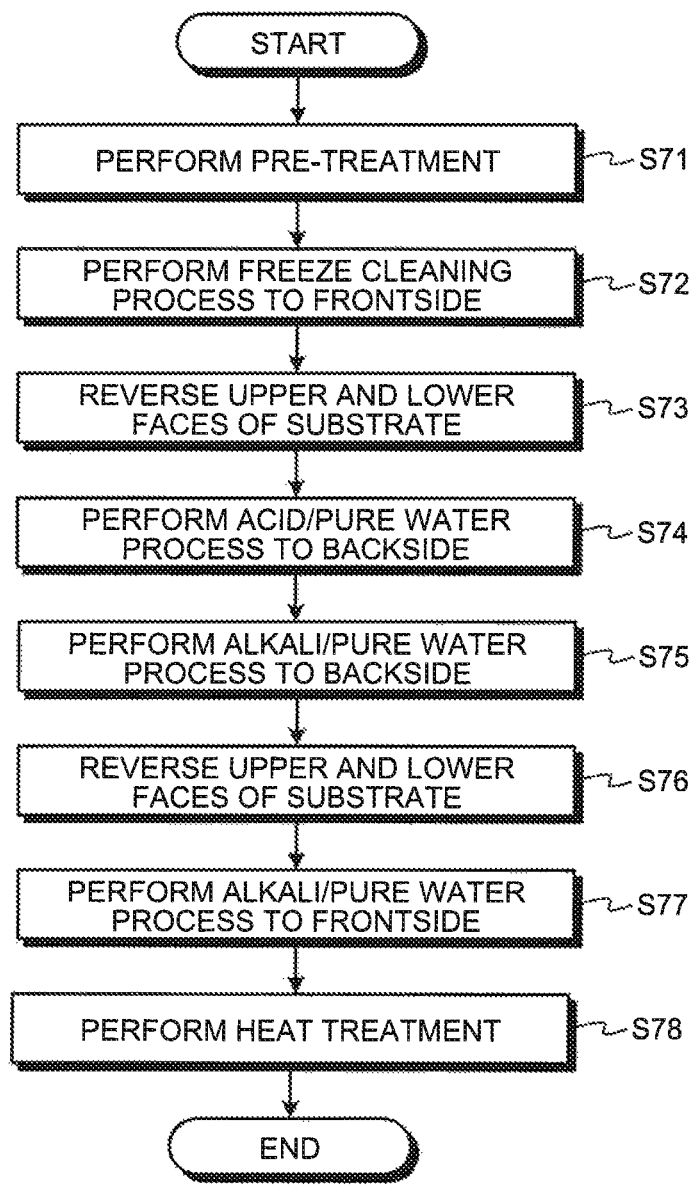
FIG. 22 is a flowchart illustrating an example of the processing sequence of a substrate processing method according to the third embodiment, in a case where there is a risk that the pattern arrangement face could be contaminated.

FIG. 22 is a flowchart illustrating an example of the processing sequence of a substrate processing method according to the third embodiment, in a case where there is a risk that the pattern arrangement face could be contaminated. First, a substrate 200 is loaded into the substrate processing system 500 through the loader/unloader 511, in a state where the frontside of the substrate 200 is on the upper side. Then, the substrate 200 is carried out of the loader/unloader 511, and is carried into the pre-treatment unit 514, by using a transfer device of the substrate conveyer 512. In the pre-treatment unit 514, a pre-treatment is performed to the substrate 200 (step S71). The pre-treatment is exemplified by the hydrophilization treatment that irradiates the upper face of the substrate 200 with UV.

Then, the substrate 200 is transferred from the pre-treatment unit 514 to the freezing unit 517 by a transfer device of the substrate conveyer 512. Then, in the freezing unit 517, the freezing process is performed to the frontside of the substrate 200 (step S72). The upper face of the substrate 200 subjected to the freezing process is in a state entirely covered with pure water.

Thereafter, the substrate 200 covered with pure water is transferred from the freezing unit 517 to the substrate reversing unit 513 by a transfer device of the substrate conveyer 512. Then, the upper and lower faces of the substrate 200 are reversed by the substrate reversing unit 513 (step S73). Specifically, the substrate 200 is reversed into a state where the frontside of the substrate 200 is on the lower side. Consequently, the upper face of the substrate 200 becomes the backside.

Then, the substrate 200 is transferred from the substrate reversing unit 513 to the acid/pure water processing unit 515 by a transfer device of the substrate conveyer 512. Then, in the acid/pure water processing unit 515, an acid process is performed to the backside of the substrate 200, and a pure water process is continuously further performed thereto (step S74). The upper face of the substrate 200 subjected to the pure water process is in a state entirely covered with pure water.

Thereafter, the substrate 200 covered with pure water is transferred from the acid/pure water processing unit 515 to the alkali/pure water processing unit 516 by a transfer device of the substrate conveyer 512. Then, in the alkali/pure water processing unit 516, an alkali process is performed, and a pure water process is continuously further performed (step S75). The upper face of the substrate 200 subjected to the pure water process is in a state entirely covered with pure water.

Then, the substrate 200 covered with pure water is transferred from the alkali/pure water processing unit 516 to the substrate reversing unit 513 by a transfer device of the substrate conveyer 512. Then, the upper and lower faces of the substrate 200 are reversed by the substrate reversing unit 513 (step S76). Specifically, the substrate 200 is reversed into a state where the frontside of the substrate 200 is on the upper side. Consequently, the upper face of the substrate 200 becomes the frontside.

Thereafter, the substrate 200 is transferred from the substrate reversing unit 513 to the alkali/pure water processing unit 516 by a transfer device of the substrate conveyer 512. Then, in the alkali/pure water processing unit 516, an alkali process is performed to the frontside of the substrate 200, and a pure water process is continuously further performed thereto (step S77). At this time, the frontside that is now the upper face of the substrate 200 is dried.

Thereafter, the substrate 200 is transferred from the alkali/pure water processing unit 516 to the heat treatment unit 519 by a transfer device of the substrate conveyer 512. Then, in the heat treatment unit 519, a heat treatment for removing moisture attaching to the surface of the substrate 200 is performed (step S78). Thereafter, the substrate 200 is transferred from the heat treatment unit 519 to the loader/unloader 511 by a transfer device of the substrate conveyer 512. Then, the substrate 200 is unloaded from the substrate processing system 500 through the loader/unloader 511. As a result, the substrate processing method ends.

Figure 23:
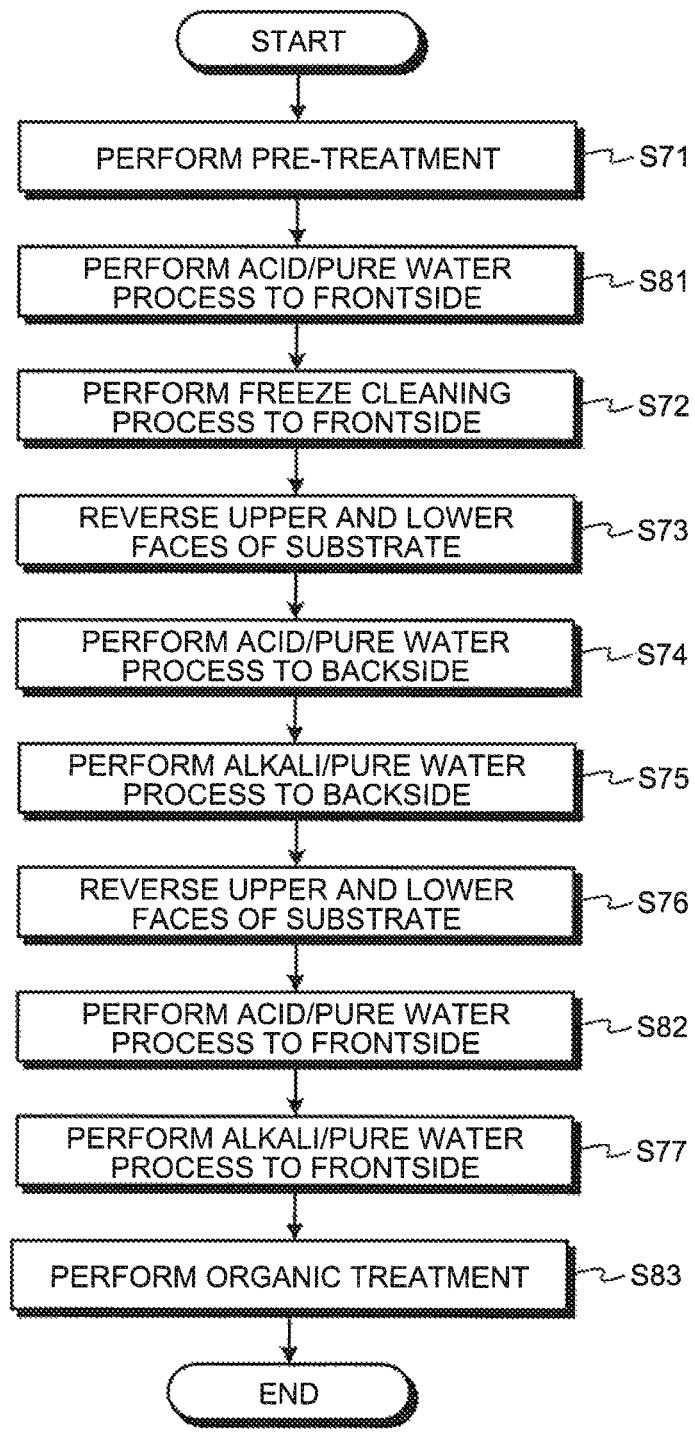
FIG. 23 is a flowchart illustrating another example of the processing sequence of a substrate processing method according to the third embodiment, in a case where there is a risk that the pattern arrangement face could be contaminated.

FIG. 23 is a flowchart illustrating another example of the processing sequence of a substrate processing method according to the third embodiment, in a case where there is a risk that the pattern arrangement face could be contaminated. In the flowchart of FIG. 23, as compared with that of FIG. 22, an acid process and a pure water process are continuously performed to the upper face that is the frontside of the substrate 200 here, in the acid/pure water processing unit 515 (step S81), between the pre-treatment of step S71 and the freezing process of step S72.

Further, an acid process and a pure water process are continuously performed to the upper face that is the frontside of the substrate 200 here, in the acid/pure water processing unit 515 (step S82), between the operation of reversing the upper and lower faces in step S76 and the alkali/pure water process to the frontside in step S77.

Further, in place of the heat treatment in step S78, an organic treatment is performed to the upper face that is the frontside of the substrate 200 here, in the organic treatment unit 518 (step S83).

The other steps are substantially the same as those described with reference to FIG. 22, and thus their description will be omitted. Further, FIGS. 22 and 23 illustrate mere examples. There are different types of variations in the substrate processing method, depending on the employed cleaning process, as described with reference to FIG. 21.

Figure 24:
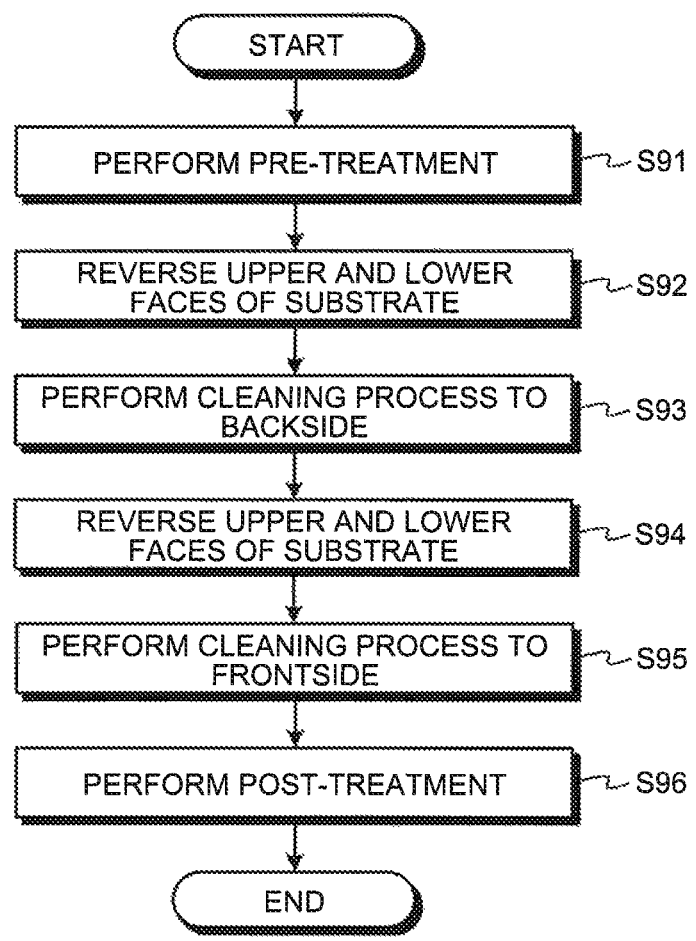
FIG. 24 is a flowchart illustrating an example of an outline of the sequence of a substrate processing method according to the third embodiment, in a case where there is no risk that the pattern arrangement face could be contaminated.

FIG. 24 is a flowchart illustrating an example of an outline of the sequence of a substrate processing method according to the third embodiment, in a case where there is no risk that the pattern arrangement face could be contaminated. First, in a state where the frontside of a substrate 200 is on the upper side, a pre-treatment is performed to the frontside that is now the upper face of the substrate 200 (step S91).

Then, the substrate 200 is reversed (step S92), to set a state where the frontside of the substrate 200 is on the lower side, and a cleaning process is performed to the backside that is now the upper face of the substrate 200 (step S93). As the cleaning process, at least one or more processes of the acid/pure water process, the alkali/pure water process, the pure water process, and the freezing process are performed.

Thereafter, the substrate 200 is reversed (step S94), to set a state where the frontside of the substrate 200 is on the upper side, and a cleaning process is performed to the frontside that is now the upper face of the substrate 200 (step S95). As the cleaning process, at least one or more processes of the acid/pure water process, the alkali/pure water process, the pure water process, and the freezing process are performed.

Then, in a state where the frontside of the substrate 200 is on the upper side, a post-treatment is performed to the upper face of the substrate 200 (step S96). As the post-treatment, at least one or more treatments of the organic treatment and the heat treatment are performed. Here, the post-treatment is not performed, as the case may be. As a result, the processing sequence ends.

Figure 25:
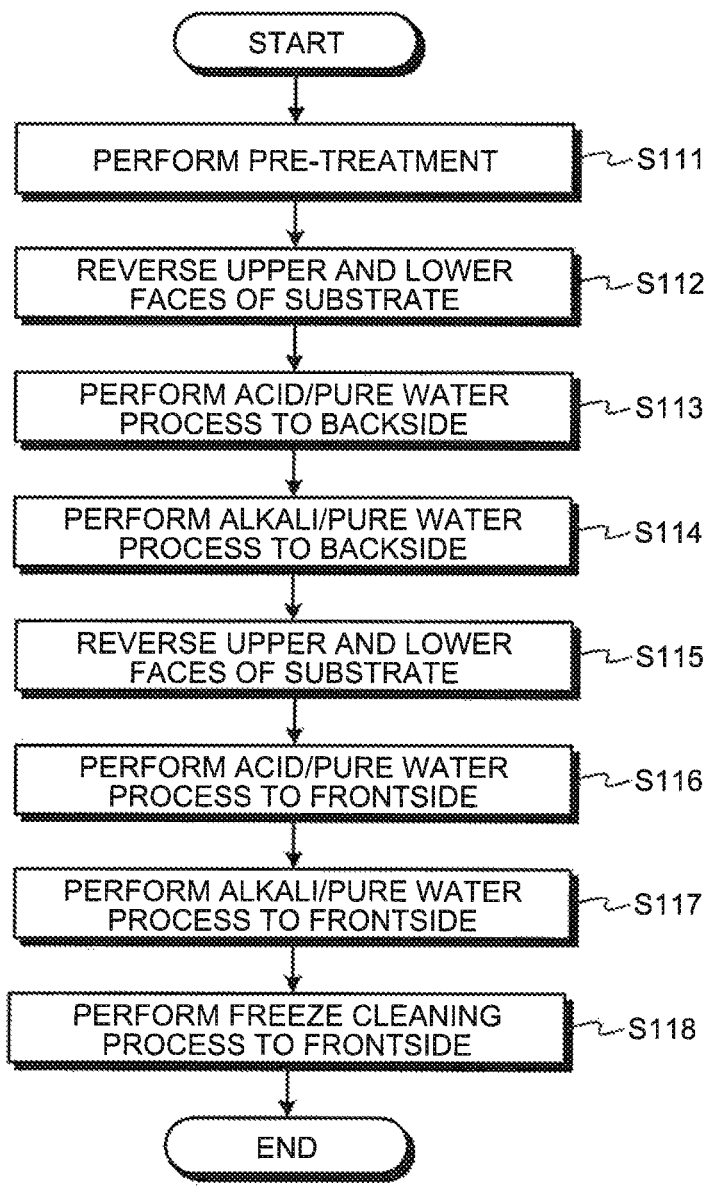
FIG. 25 is a flowchart illustrating an example of the processing sequence of a substrate processing method according to the third embodiment, in a case where there is no risk that the pattern arrangement face could be contaminated.

FIG. 25 is a flowchart illustrating an example of the processing sequence of a substrate processing method according to the third embodiment, in a case where there is no risk that the pattern arrangement face could be contaminated. First, a substrate 200 is loaded into the substrate processing system 500 through the loader/unloader 511, in a state where the frontside of the substrate 200 is on the upper side. Then, the substrate 200 is carried out of the loader/unloader 511, and is carried into the pre-treatment unit 514, by using a transfer device of the substrate conveyer 512. In the pre-treatment unit 514, a pre-treatment is performed to the substrate 200 (step S111). The pre-treatment may be exemplified by the hydrophilization treatment that irradiates the upper face of the substrate 200 with UV.

Then, the substrate 200 is transferred from the pre-treatment unit 514 to the substrate reversing unit 513 by a transfer device of the substrate conveyer 512. Then, the upper and lower faces of the substrate 200 are reversed by the substrate reversing unit 513 (step S112). Specifically, the substrate 200 is reversed into a state where the frontside of the substrate 200 is on the lower side. Consequently, the upper face of the substrate 200 becomes the backside.

Then, the substrate 200 is transferred from the substrate reversing unit 513 to the acid/pure water processing unit 515 by a transfer device of the substrate conveyer 512. Then, in the acid/pure water processing unit 515, an acid process is performed to the backside of the substrate 200, and a pure water process is continuously further performed thereto (step S113). The upper face of the substrate 200 subjected to the pure water process is in a state entirely covered with pure water.

Thereafter, the substrate 200 covered with pure water is transferred from the acid/pure water processing unit 515 to the alkali/pure water processing unit 516 by a transfer device of the substrate conveyer 512. Then, in the alkali/pure water processing unit 516, an alkali process is performed, and a pure water process is continuously further performed (step S114). The upper face of the substrate 200 subjected to the pure water process is in a state entirely covered with pure water.

Then, the substrate 200 covered with pure water is transferred from the alkali/pure water processing unit 516 to the substrate reversing unit 513 by a transfer device of the substrate conveyer 512. Then, the upper and lower faces of the substrate 200 are reversed by the substrate reversing unit 513 (step S115). Specifically, the substrate 200 is reversed into a state where the frontside of the substrate 200 is on the upper side. Consequently, the upper face of the substrate 200 becomes the frontside.

Thereafter, the substrate 200 is transferred from the substrate reversing unit 513 to the acid/pure water processing unit 515 by a transfer device of the substrate conveyer 512. Then, in the acid/pure water processing unit 515, an acid process is performed to the frontside of the substrate 200, and a pure water process is continuously further performed thereto (step S116). The upper face of the substrate 200 subjected to the pure water process is in a state entirely covered with pure water.

Then, the substrate 200 is transferred from the acid/pure water processing unit 515 to the alkali/pure water processing unit 516 by a transfer device of the substrate conveyer 512. Then, in the alkali/pure water processing unit 516, an alkali process is performed to the frontside of the substrate 200, and a pure water process is continuously further performed thereto (step S117). At this time, the frontside that is now the upper face of the substrate 200 is dried.

Thereafter, the substrate 200 is transferred from the alkali/pure water processing unit 516 to the freezing unit 517 by a transfer device of the substrate conveyer 512. Then, in the freezing unit 517, the freezing process is performed to the frontside of the substrate 200 (step S118). The frontside of the substrate 200 is dried in the freezing process.

Thereafter, the substrate 200 is transferred from the freezing unit 517 to the loader/unloader 511 by a transfer device of the substrate conveyer 512. Then, the substrate 200 is unloaded from the substrate processing system 500 through the loader/unloader 511. As a result, the substrate processing method ends.

Figure 26:
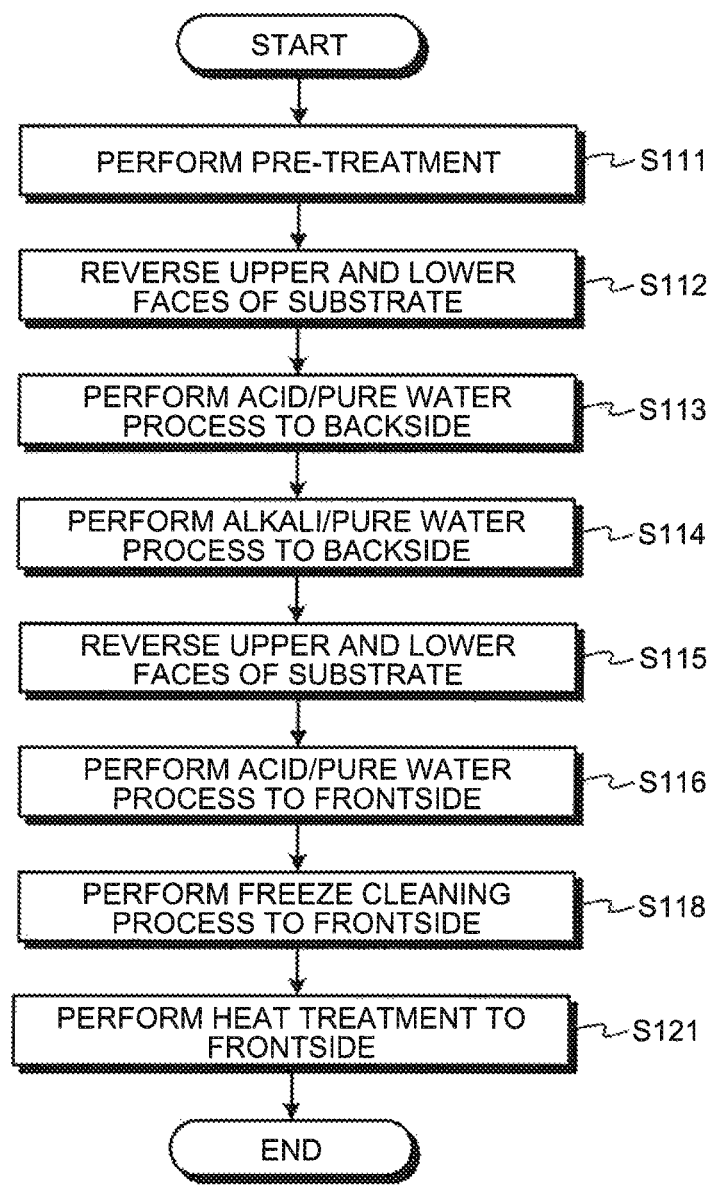
FIG. 26 is a flowchart illustrating another example of the processing sequence of a substrate processing method according to the third embodiment, in a case where there is no risk that the pattern arrangement face could be contaminated.

FIG. 26 is a flowchart illustrating another example of the processing sequence of a substrate processing method according to the third embodiment, in a case where there is no risk that a pattern arrangement face could be contaminated. In the flowchart of FIG. 26, as compared with that of FIG. 25, the alkali/pure water process of step S117 is omitted, and a heat treatment is performed to the upper face that is the frontside of the substrate 200 here, in the heat treatment unit 519 (step S121), after the freezing process of step S118.

The other steps are substantially the same as those described with reference to FIG. 25, and thus their description will be omitted. Further, FIGS. 25 and 26 illustrate mere examples. There are different types of variations in the substrate processing method, depending on the employed cleaning process, as described with reference to FIG. 24.

In the third embodiment, the substrate 200 is transferred in a state where the upper face of the substrate 200 is entirely covered with pure water, between the acid/pure water processing unit 515, the alkali/pure water processing unit 516, and the freezing unit 517. Consequently, when the substrate 200 is transferred between respective units used for cleaning, the substrate 200 can prevent impurities from attaching thereto.

Where the probability of impurity attachment to the frontside of a substrate 200 is low in cleaning, the backside of the substrate 200 is first cleaned, and the frontside is then cleaned. On the other hand, where the probability of impurity attachment to the frontside of a substrate 200 is high in cleaning, the frontside of the substrate 200 is first cleaned, the backside is then cleaned, and, thereafter, the frontside is cleaned again. In this way, depending on the level of handling impurities in units used for cleaning, a change is made to the number of times of cleaning to be performed to the frontside and backside of a substrate 200. Accordingly, where the probability of impurity attachment to the frontside of a substrate 200 is low in cleaning, the number of times of cleaning to be performed to the substrate 200 can be reduced, and thus the manufacturing cost of semiconductor devices can be lowered.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus comprising:
   a substrate holder configured to hold a substrate in a state where a first face of the substrate is on an upper side;
   a processing liquid supply section including a plurality of processing liquid storage parts that store processing liquids different in pH, and configured to supply at least one of the processing liquids onto the first face;
   a cooling medium supply section including a cooling medium storage part that is capable of storing a cooling medium, the cooling medium supply section being configured to solidify a processing liquid supplied on the first face;
   a gas bubble injection part configured to inject gas bubbles into the processing liquid supplied on the first face; and
   a controller configured to:
   select a processing liquid having a pH with which a surface zeta potential of the substrate becomes negative and a surface zeta potential of a foreign substance attaching to the first face becomes positive, and
   cause:
   the processing liquid supply section to supply the selected processing liquid onto the first face,
   the gas bubble injection part to inject gas bubbles into the processing liquid supplied on the first face, and
   the cooling medium supply section to supply the cooling medium to solidify the processing liquid having the gas bubbles injected therein on the first face.

2. The substrate processing apparatus according to claim 1, wherein the gas bubble injection part is an ultrasonic wave applying device that applies ultrasonic waves to the processing liquid on the substrate.

3. The substrate processing apparatus according to claim 1,
   wherein the gas bubble injection part is an electrolysis device that performs electrolysis to the processing liquid by immersing metal electrodes into the processing liquid on the substrate.

4. The substrate processing apparatus according to claim 1, wherein the substrate is a quartz substrate.

5. The substrate processing apparatus according to claim 1, wherein the first face is a patterned face including a protruding portion.

* * * * *